United States Patent
Nishizaka et al.

(10) Patent No.: US 7,268,385 B2
(45) Date of Patent: Sep. 11, 2007

(54) SEMICONDUCTOR MEMORY DEVICE

(75) Inventors: Teiichirou Nishizaka, Kanagawa (JP); Kohji Kanamori, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 390 days.

(21) Appl. No.: 10/892,553

(22) Filed: Jul. 16, 2004

(65) Prior Publication Data
US 2005/0029577 A1    Feb. 10, 2005

(30) Foreign Application Priority Data
Jul. 17, 2003  (JP)  ............... 2003-275943
Jul. 12, 2004  (JP)  ............... 2004-204545

(51) Int. Cl.
*H01L 29/788*   (2006.01)
(52) U.S. Cl. ............... 257/315; 257/324; 257/296; 257/341; 257/E21.68
(58) Field of Classification Search ............... None
See application file for complete search history.

(56) References Cited

U.S. PATENT DOCUMENTS

| | | | | |
|---|---|---|---|---|
| 6,011,725 A | 1/2000 | Eitan | ............... | 365/185.33 |
| 6,256,231 B1 | 7/2001 | Lavi et al. | ............... | 365/185.29 |
| 6,330,187 B1* | 12/2001 | Choi et al. | ............... | 365/185.15 |
| 6,388,293 B1 | 5/2002 | Ogura et al. | ............... | 257/365 |
| 6,399,441 B1 | 6/2002 | Ogura et al. | ............... | 438/257 |
| 2003/0073275 A1* | 4/2003 | Kianian et al. | ............... | 438/201 |

FOREIGN PATENT DOCUMENTS

| | | |
|---|---|---|
| JP | 2001-512290 | 2/1999 |
| JP | 2001-156189 | 11/1999 |
| JP | 2001-230332 | 8/2001 |
| JP | 2001-357681 | 12/2001 |
| JP | 2002-26149 | 1/2002 |

OTHER PUBLICATIONS

Hideto Tomiye, et al., "A novel 2-bit/cell MONOS memory device with a wrapped-control-gate structure that applies source-side hot-electron injection", 2002 Symposium on VLSI Technology Digest of a Technical Papers, pp. 206-207.

* cited by examiner

*Primary Examiner*—Sue A. Purvis
*Assistant Examiner*—Scott R. Wilson
(74) *Attorney, Agent, or Firm*—McGinn IP Law Group, PLLC

(57) ABSTRACT

A semiconductor memory device comprises diffusion regions, a floating gate, a third diffusion region, a selection gate electrode, and a control gate electrode that three-dimensionally crosses the selection gate electrode and extends in a direction orthogonal to the selection gate electrode are included. A channel formed immediately below the selection gate and which constitutes a passage connecting the two diffusion regions has a shape in a top view, including a first path extending in one direction, from one diffusion region, and a second path extending from the end of the first path to the other diffusion region in a direction orthogonal to a first direction.

24 Claims, 30 Drawing Sheets

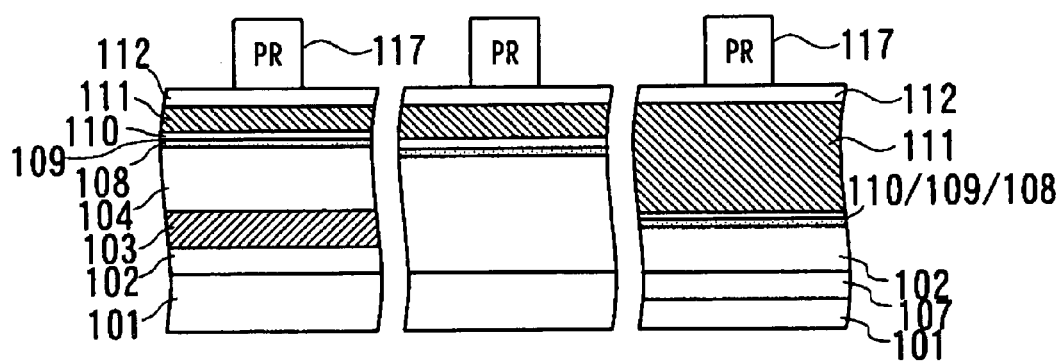

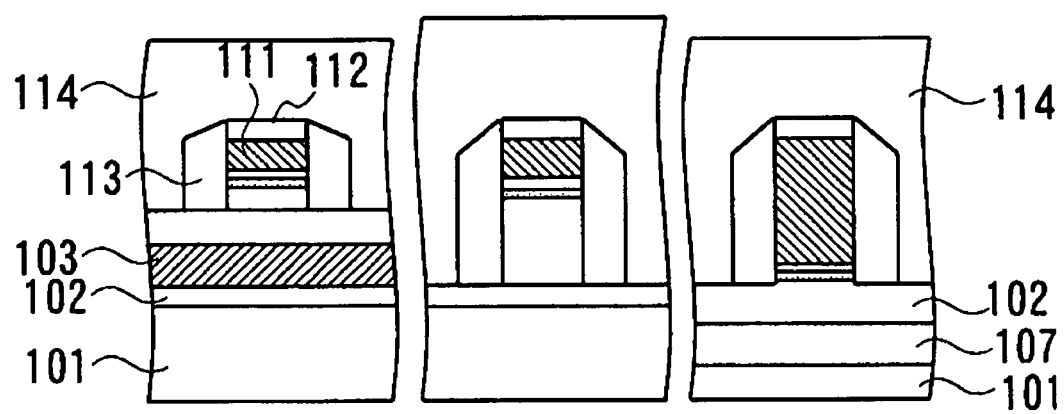

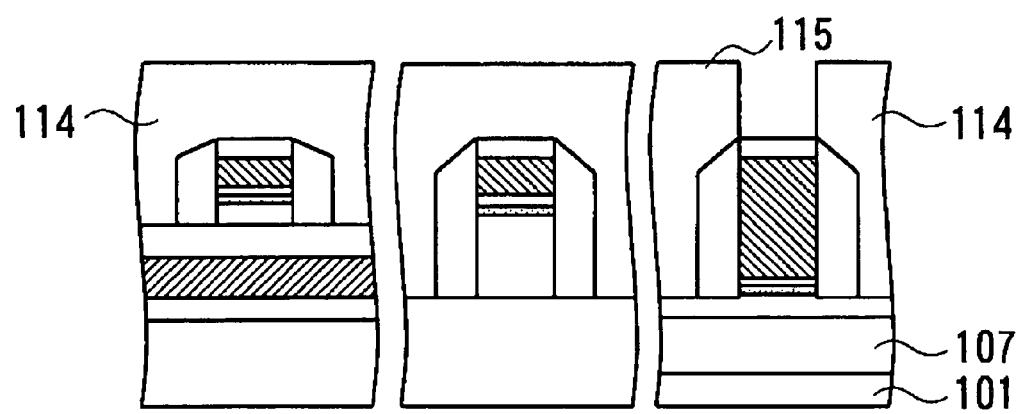

FIG. 24A  PRIOR ART
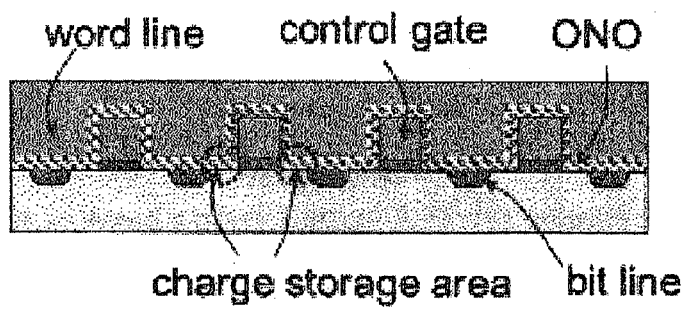
FIG. 24B  PRIOR ART
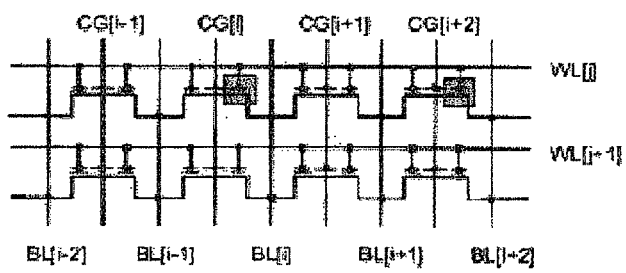
FIG. 24C  PRIOR ART
|  | Wli (j) | WL(k≠j) | BL(I+2n) | BL(I+2n-1) | CG(I+2n) | CG(I+2n-1) |
|---|---|---|---|---|---|---|
| Prog | 9.0V | 0.0V | 5.0V | 0.0V | 1.0V/0.0V | 0.0V |
| Erase | 0.0V | 0.0V | 7.0V | 0.0V | 5.0V | 0.0V |
| Read | Vread | 0.0V | 0.0V | 1.5V | 1.5V | 0.0V |

SEMICONDUCTOR MEMORY DEVICE

FIELD OF THE INVENTION

The present invention relates to a semiconductor memory device. More specifically, the invention relates to a programmable nonvolatile semiconductor memory device.

BACKGROUND OF THE INVENTION

As a conventional semiconductor memory device of this type, a cell transistor as shown schematically in FIG. 22 is known as a nonvolatile semiconductor memory device for storing two-bit information per cell. On a substrate in a region where a channel is formed between diffusion regions 12A and 12B provided in the surface of a substrate 11, an insulating film 13 and a control gate electrode 15 are provided, and insulating films 14 and word line electrodes 16 are provided on both sides of the insulating film 13 and the control gate electrode 15.

As memory cells of this type, those in the following nonpatent document 1 and following patent documents 1 to 5, and the like, for example, are referred to. As a memory that can store two bits on both sides of a charge trapping film immediately below a gate electrode independently, those in the following patent documents 6 to 9 are referred to.

Further, a configuration as shown in FIG. 23 is proposed as another configuration of the memory cell for storing two bits per cell. According to a description in the following patent document 9, for example, the nonvolatile memory of an MONOS structure having an insulating film (which will be referred to as an ONO (oxide-nitride-oxide-film) in which a silicon dioxide film, a silicon nitride film, and a silicon dioxide film are stacked atop one another on a substrate in this stated order as the gate insulating film 14 can store two-bit data per cell in the charge trapping film (silicon nitride film) sandwitched between the silicon dioxide films immediately below the gate electrode. In an EEPROM (Electrically Erasable and Programmable ROM) memory cell having the charge trapping film and nodes for storing two bits per cell, two individual bits or a left Node 1 and a right Node 2 are formed in a region spatially separated in the charge trapping region. Reading of two bits (in storage nodes) is performed in a direction opposite to the direction of its writing. For writing to the node 2 in the charge trapping film in the ONO film 14, positive voltages for writing are applied to the gate electrode 16 and the drain diffusion region 12B, the source diffusion region 12A is grounded, and sufficiently accelerated hot electrons are injected into a region in the charge trapping film in the ONO film 14, adjacent to the drain diffusion region 12B. Then, reading of a stored bit is performed in a direction opposite to the direction of writing: in order to perform reading, positive voltages are respectively applied to the gate electrode 16 and the source diffusion region 12A, and the drain diffusion region 12B is grounded. For erasure in the memory cell, an appropriate erasure voltage is applied to the gate electrode 16, for example. Then, in order to perform erasure in the Node 2, an erasing voltage is applied to the drain diffusion region 12B, and in order to perform erasure in the Node 1, the erasing voltage is applied to the source diffusion region 12A, thereby ejecting electrons from the charge trapping film. As described above, by setting predetermined gate voltage, and predetermined drain and source voltages, two bits can be stored on both sides of the charge trapping film immediately below the gate electrode, independently.

Next, a two-bit/cell MONOS memory device described in the following nonpatent document 1 will be described in detail.

The following nonpatent document 1 discloses a sectional view and an equivalent circuit of a MONOS memory having a two-bit-per-cell configuration and bias conditions at the times of writing, erasing and reading operations, as shown in FIGS. 24A through 24C.

A memory cell includes a pair of impurity diffusion regions (a pair of bit lines) provided in the surface of a substrate, a control gate CG provided on the silicon dioxide film on the surface of the substrate between the diffusion regions, and word lines WL on the ONO film provided on both sides of the silicon dioxide film on the surface of the substrate, extending in a direction orthogonal to the control gate. Writing to nodes (programming) is performed by source-side hot-electron injection, and erasure is performed by hot hole injection.

According to the following nonpatent document 1, respective storage sites under a word line WL[j] on the right hand side of a control gate CG[I+2n] are programmed in parallel. A bit line BL[I+2n−1] is set at a ground potential, a bit line BL[I+2n] is biased to 5.0 V, and a word line WL[j] is biased to 9.0 V. The control gate CG[I+2n] is biased to 1.0V/0.0V so as to induce/inhibit source-side hot-electron injection. Information stored on the right hand side of the control gate is erased by hot hole injection brought about by the bias conditions in FIG. 24C. At the time of reading, on the other hand, the bit line[I+2n−1] is biased to 1.5V, bit line [i+2n] is biased to 0.0V, word line WL[j] is biased to Vread, and the control gate CG[I+2n] is biased to 1.5V. In order to program/erase storage sites on the left hand side of the control gate CG[I+2n], the bias conditions for the bit line BL[I+2n−1] and the BL[I+2n] are exchanged. Reading of respective bits of the memory cells is performed by application of reverse reading, as shown in FIG. 24C.

[Nonpatent Document 1]
"A novel 2-bit/cell MONOS memory device with a wrapped-control-gate structure that applies source-side hot-electron injection", 2002 Symposium on VLSI technology Digest of a Technical Papars, p206-207.

[Patent Document 1]
Japanese Patent Kokai Publication No. JP-P2001-230332A (p19, FIG. 27)

[Patent Document 2]
Japanese Patent Kokai Publication No. JP-P2002-26149A (p16, FIG. 23)

[Patent Document 3]
Japanese Patent Kokai Publication No. JP-P2001-357681A (pp 6-7, FIG. 2 and FIG. 3)

[Patent Document 4]
U.S. Pat. No. 6,399,441

[Patent Document 5]
U.S. Pat. No. 6,388,293

[Patent Document 6]
U.S. Pat. No. 6,011,725

[Patent Document 7]
U.S. Pat. No. 6,256,231

[Patent Document 8]
Japanese Patent Kokai Publication No. JP-P2001-156189A (p2, FIG. 1)

[Patent Document 9]
Japanese Patent Kohyo Publication No. JP-P2001-512290A (pp45-47, FIG. 2)

SUMMARY OF THE DISCLOSURE

Next, referring to FIGS. 25A and 25B, a writing (programming) operation on the memory cell described in the above nonpatent document 1 will be considered. The following shows a result of analysis based on the result of study by the inventors of the present invention.

FIG. 25A is a diagram showing a configuration of the memory cell described in the above nonpatent document 1. Referring to FIG. 25A, reference numeral 201 denotes the semiconductor substrate, reference numeral 202 denotes an N+ diffusion region (termed e.g. "heavily doped N+ region", also simply referred to as a "diffusion region"), reference numeral 203 denotes a gate insulating film, reference numeral 204 denotes the ONO film, reference numeral 205 denotes the control gate (electrode), and reference numeral 206 denotes the word line (electrode). When writing (programming) to a Node 1 is performed, a voltage of 5V is applied to a bit line BL1, and a voltage of 0V is applied to a BL2. Further, a voltage of 9V is applied to the word line 206 (VWL=9V). At this point, a voltage of 1V is applied to the control gate 205 (VCG=1.0V), thereby limiting the current that flows through a channel to a low level. That is, since a channel resistance increases, an electric field is concentrated as shown in FIG. 25B. Thus, electrons are injected into the ONO film 204. The maximum electric filed point occurs in a boundary between the word line 206 and the control gate 205. Electrons that have moved from a source diffusion region (BL2) is accelerated around a portion having the maximum electric field intensity in which the electric filed is concentrated, and have a high energy. The accelerated electrons are sucked to a positive electric filed in the word line 206, and then trapped in a region in the ONO film 204 that is slightly nearer to the drain diffusion region (BL1) than the boundary between the word line 206 and the control gate 205. Meanwhile, writing to a storage node on an opposite side, can be carried out by interchanging bias voltages between a source and a drain, contrary to the above description.

The region in the ONO film 204 where the electrons are trapped (indicated by a black ellipse pointed at by the Node 1 in FIG. 25A) is around the boundary between the word line electrode 206 and the control gate electrode 205, and is present a certain distance away from the drain diffusion region 202 (BL1).

As described above, the program operation utilizes the phenomenon of source-side injection.

Next, referring to FIG. 26, a read operation from a memory cell, described in the above nonpatent document 1 will be considered. A case where electrons are not trapped in the first node (Node 1), while electrons are trapped in a second node (Node 2) will be described below.

When reading from the first node (Node 1) is performed, a voltage of 1.5V is applied to the bit line BL2, and a voltage of 0V is applied to the bit line BL1. That is, the reading is performed with the diffusion region 202 of the node from which the reading is performed, as the source. Since the electrons are not trapped in the first node (Node 1), a read current ought to flow through the memory cell. However, the electrons trapped in the second node (Node 2) affect the potential of the surface of the channel, so that a channel current becomes difficult to flow.

In order to avoid this problem, a comparatively high voltage should be applied to the bit line BL2 to extend a depletion layer 207, thereby to hide the influence of the electrons trapped in the second node (Node 2).

Further, a distance between an electron-trapped region located around the boundary between the word line electrode 206 and the control gate electrode 205 and the diffusion region around the bit line (refer to FIG. 26), (in this specification, this distance will be referred to as a "trap space") is affected by variations in manufacturing processes.

When the trap space is large, for example, there is a need to apply a large voltage to the BL diffusion region 202. If the trap space becomes approximately 0.1 μm, a voltage of 2-3V becomes necessary.

Then, when the distance of the trap space varies due to the manufacturing variations, the channel current fluctuates. A stable circuit operation thereby becomes difficult to obtain.

Next, the relationship between the trap space and the channel current will be described, based on results of analysis by the inventors of the present invention.

FIG. 27A shows voltage-to-current (V-I) characteristics of a memory cell transistor in which no electrons are trapped in the first node (Node 1) and the second node (Node 2). In this case, the characteristics of the transistor in a normal state are shown. Incidentally, The voltage-to-current characteristics in FIG. 27 are obtained from measured drawings of a device prototyped by the inventors of the present invention.

On the other hand, FIG. 27B shows the characteristics of the channel current (plotted along the vertical axis of the drawing) when electrons are trapped in the second node (Node 2) alone or a drain voltage (plotted along the horizontal axis of the drawing) is applied to the second node (Node 2). A same voltage Vg is applied to the control gate and the word line.

The trap space of this memory cell is estimated to be approximately 0.03 μm to 0.05 μm. When the trap space is small as described above, a sufficient current can be secured by just applying approximately 1.5V to the drain.

However, when a long trap space is artificially created as shown in FIG. 27C, it is no longer easy to secure the channel current of the memory cell. More specifically, when the condition corresponding to the case where the voltage Vg applied to the control gate and the word line is set to 4V is created artificially, only a slight channel current flows with the use of the drain voltage of 1.5V, and no channel current flows when the Vg is set to 3V.

It can be seen that, as described above, the current of the memory cell greatly depends on the length of the trap space and is greatly affected by the manufacturing variations.

Next, referring to FIG. 28, erasure in the memory cell (an erase operation) described in the above nonpatent document 1 will be described. The erase operation utilizes the phenomenon of hot hole injection, and performs erasing by neutralizing electrons trapped in the electron trapped region by holes.

When neutralizing electrons trapped in the first node (Node 1), a high voltage (such as a VBN of 7.0V) is applied to the terminal of the bit diffusion region (BL1). Then, hot holes are generated at the junction between the N-type diffusion region 202 and the P-type silicon substrate 201 due to the phenomenon of band to band tunneling. These holes are drawn to the potential of the word line 206 and thereby injected into the ONO film 204.

The holes diffuse toward the second node (Node 2) so that they oppose the potential at the N-type diffusion region 202 at the BL1 terminal. However, the amount of the holes drawn to the potential at the word line 206 and then injected into the ONO film 204 is actually only a few.

Further, when the trap space is too long, the generated holes diffuse and expand throughout the silicon substrate 201. Thus, the phenomenon of neutralization becomes difficult to occur.

As described above, the problems of the conventional semiconductor memory device described in the above non-patent document 1 are summarized as follows:

(A) The memory cell current at the time of reading depends on the length of the trap space which is readily affected by the manufacturing variations. Thus, stable characteristics cannot be obtained.

(B) Erasure characteristics depend on the length of the trap space and are unstable.

(C) There has been no approach for realizing the length of the trap space that are difficult to be affected by the manufacturing variations.

Accordingly, it is an object of the present invention to provide a semiconductor memory device suitable for obtaining a stable circuit operation and reducing a circuit size.

The above and other objects are attained by a semiconductor memory device in accordance with one aspect of the present invention, which comprises:

at least a gate including an insulating film provided on a semiconductor substrate and a conductive film provided on the insulating film; and first and second diffusion regions provided in a surface layer of the semiconductor substrate;

wherein a channel which is formed in the surface layer of the semiconductor substrate immediately below the gate and constituting a passage connecting the two diffusion regions that become a source and a drain, has a shape in a top view of the semiconductor substrate (i.e., when the semiconductor substrate is seen from above), including:

a first path extending from one of the diffusion regions in one direction defined in association with the planar shape of the gate; and a second path extending from an end of the first path to the other one of the diffusion regions in a direction at a predetermined angle with the one direction.

In the present invention, the gate is a selection gate provided above the semiconductor substrate and disposed to be adjacent to a floating gate constituting a storage node. According to the present invention, a current flowing through the channel constituting the passage between source and drain diffusion regions (or a channel current) flows in parallel to the selection gate, and then flows in a direction perpendicular to the selection gate from a position below the center of the selection gate, for example.

In the present invention, in the surface layer of the semiconductor substrate, a third diffusion region is provided. The third diffusion region is disposed to face one of the two diffusion regions (referred to as the "second diffusion region") with the gate interposed between the third diffusion region and the second diffusion region. A first floating gate constituted from a first conductive film provided above the substrate between the second diffusion region and the gate through an insulating film, a second floating gate constituted from a second conductive film provided above the substrate between the gate and the third diffusion region through the insulating film, and a control gate constituted from a third conductive film provided in common over the first and second floating gates through an insulating film are included. The control gate constitutes a word line, and the second diffusion region and the third diffusion region are connected to respective corresponding bit lines.

In the present invention, a unit cell includes:

a first diffusion region provided in the surface of a substrate;

a first insulating film provided in a first region on the substrate adjacent to the first diffusion region;

a first gate electrode provided on the first insulating film and constituting a floating gate; a second insulating film provided on the first gate electrode;

a second gate electrode provided on the second insulating film and constituting a control gate;

a third insulating film provided in a second region on the substrate adjacent to the first diffusion region; and a third gate electrode provided on the third insulating film and constituting a selection gate.

The second gate electrode three-dimensionally crosses the third gate electrode, and a second diffusion region is provided in a third region in the surface of the substrate located at the extension of the third gate electrode.

In the present invention, a cell for storing two-bit information includes:

a first diffusion region and a second diffusion region, provided in the surface of a substrate to be apart to each other; a selection gate electrode disposed in a region above the substrate between the first diffusion region and the second diffusion region through a first insulating film;

one or more separate diffusion regions disposed in one or more regions in the surface of the substrate, located at one or both ends of the selection gate in its longitudinal direction;

a first floating gate electrode disposed in a first region between the first diffusion region and the selection gate through a second insulating film and a second floating gate electrode disposed in a second region between the second diffusion region and the selection gate through a third insulating film; and a control gate electrode disposed over the first floating gate electrode, the second floating gate electrode, and the selection gate electrode through a fourth insulating film.

The first diffusion region, the first floating gate, the control gate electrode, the selection gate electrode, and the separate diffusion region constitute a first unit cell, while the second diffusion region, the second floating gate, the control gate electrode, the selection gate electrode, and the separate diffusion region constitute a second unit cell.

In a semiconductor memory device according to another aspect of the present invention, the layout of a memory cell array includes:

a plurality of diffusion regions extending in parallel to one another and apart from one another along one direction in a memory cell area in a surface of a semiconductor substrate; each of said plurality of diffusion regions connected to a bit line corresponding thereto;

a plurality of selection gate electrodes, each disposed in a region above said semiconductor substrate between two of said diffusion regions adjacent to each other, through an insulating film and extending in said one direction;

one or more separate diffusion regions extending in a direction orthogonal to said one direction and provided at one or more positions in said surface layer of said semiconductor substrate, said one or more positions being separated from one end or both ends of said plurality of diffusion regions in a longitudinal direction thereof;

said selection gate electrodes crossing said one or more separate diffusion regions through an insulating film;

a first floating gate electrode provided in a first region between one of said two diffusion regions adjacent to each other and said selection gate electrode through an insulating film;

a second floating gate electrode provided in a second region between said selection gate electrode the other one of said two diffusion regions adjacent to each other through said insulating film; and a control gate electrode provided in common to said first floating gate and said second floating gate, said control gate electrode provided over said first floating gate and said second floating gate through a fourth insulating film.

A first unit cell is constituted from the one of said two diffusion regions, said first floating gate, said control gate electrode, said selection gate electrode, and said separate diffusion region and a second unit cell is constituted from the other one of said two diffusion regions, said second floating gate, said control gate electrode, said selection gate electrode, and said separate diffusion region.

In the present invention, writing to the floating gate of a cell is performed by:

setting a selected word line (control gate electrode) to a positive voltage;

applying a threshold voltage (Vt) or a voltage higher than the threshold voltage (Vt) by a predetermined voltage to the selection gate electrode of the selected cell; and applying a positive voltage to the bit line connected to the diffusion region for the cell, thereby using the separate diffusion region as an electron supply source.

In the present invention, erasure of a cell is performed by:

setting the control gate electrode of the cell to a negative voltage;

applying a predetermined positive voltage to the bit line connected to the diffusion region for the cell; and applying a positive voltage to the selection gate electrode of the cell.

In the present invention, reading from the cell with the separate diffusion region as a drain side is performed by:

applying a positive voltage to the selection gate electrode of the cell for reading;

applying a ground potential to the bit line connected to the diffusion region for the cell; and applying a positive voltage to the control gate electrode of the cell.

Further, according to the present invention, ion implantation is performed with the side walls of the floating gate on both sides of the selection gate used as a mask, so that diffusion regions are formed in the surface of the substrate in a self alignment manner. Thus, the semiconductor memory device is hard to be affected by manufacturing variations, so that a stable size can be secured.

The meritorious effects of the present invention are summarized as follows.

According to the present invention, source-side injection is carried out by using the channel for the selection gate as a source side. Thus, writing to a target storage node is performed without interposition of a non-target storage node, as a result of which, without being affected by the nontarget storage node, reliability of device characteristics is improved.

Further, according to the present invention, when reading is performed, the channel for the selection gate is positioned at a drain side. Thus, reading from and writing to a target storage node are performed without the medium of a non-target storage node. The semiconductor memory device substantially functions as a one-bit cell. Thus, an especially stable memory cell current can be secured.

As described above, according to the present invention, writing/reading for each bit can be performed in a two-bit/cell. Stabilization of the operation of the device can be achieved while achieving miniaturization of the cell.

Further, according to the present invention, by applying a positive potential to the channel for the selection gate electrode, hole diffusion is prevented. Holes are therefore injected into an electron-trapped region. Thus, efficient erasure is implemented, and resistance properties are improved.

A memory cell according to the present invention is configured to be self-aligning. Thus, its manufacturing process is facilitated.

Still other objects and advantages of the present invention will become readily apparent to those skilled in this art from the following detailed description in conjunction with the accompanying drawings wherein only the preferred embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

BRIEF DESCRIPTION OF THE DRAWINGS

FIGS. 8A through 8C are diagrams explaining the manufacturing method in the embodiment of the present invention and schematically showing sections cut through lines of A, B, and C in FIG. 6;

FIGS. 10A through 10C are diagrams explaining the manufacturing method in the embodiment of the present invention and schematically showing sections cut through the lines of A, B, and C in FIG. 6;

FIGS. 11A through 11C are diagrams explaining the manufacturing method in the embodiment of the present invention and schematically showing sections cut through the lines of A, B, and C in FIG. 6;

FIGS. 24A through 24C show a conventional art described in Nonpatent document 1; FIG. 24A shows a sectional view, FIG. 24B shows an equivalent circuit, and FIG. 24C shows a list of bias conditions for programming, erasure, and reading;

FIG. 25A shows a sectional view, and FIG. 25B shows a diagram showing an electric filed in a horizontal direction;

PREFERRED EMBODIMENTS OF THE INVENTION

Figure 1:
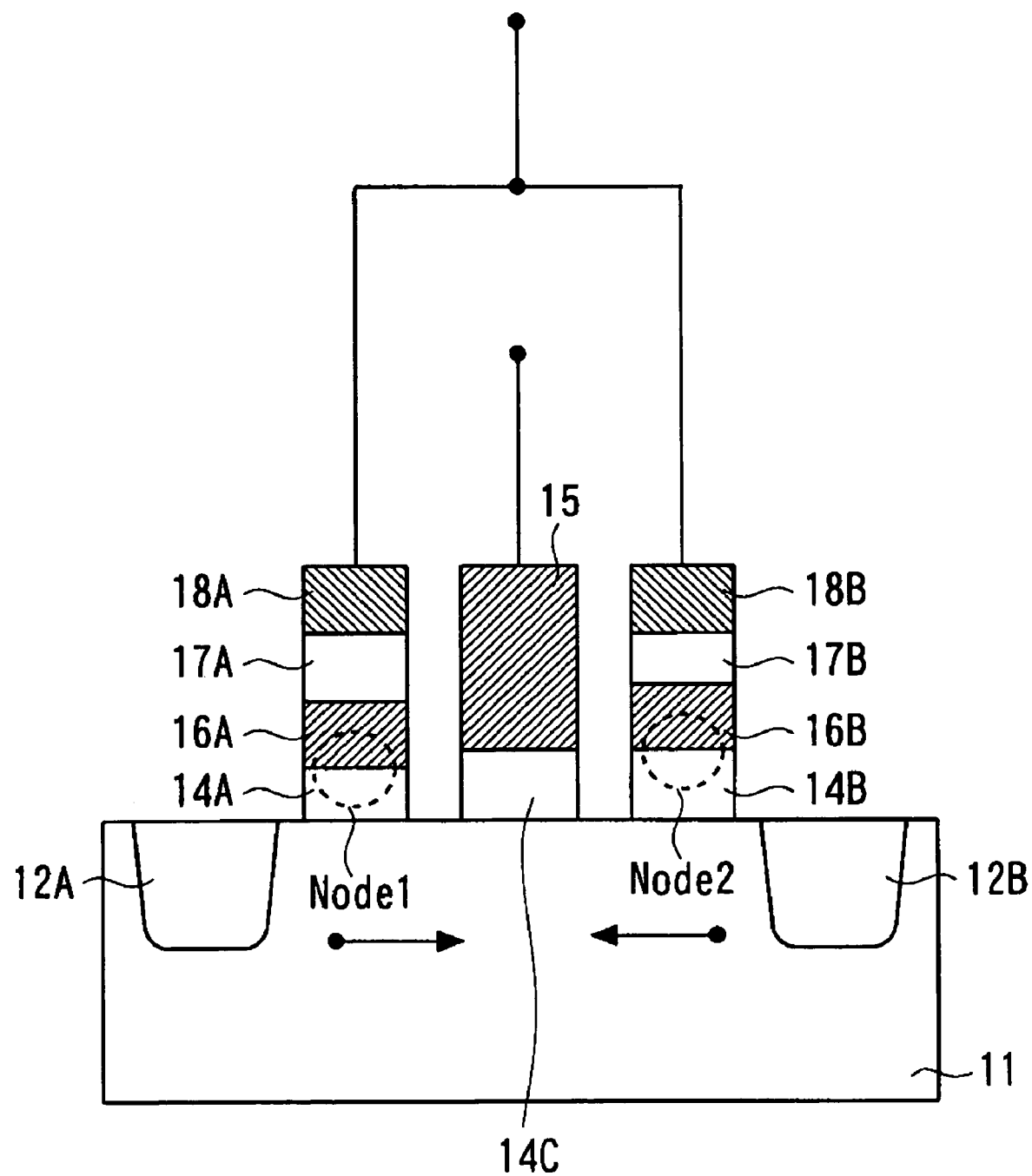
FIG. 1 is a diagram schematically showing a configuration of a memory cell according to an embodiment of the present invention.

The preferred embodiment for carrying out the present invention will be described below. FIG. 1 is a diagram for explaining the principle of a memory cell transistor according to the present invention. Referring to FIG. 1, the configuration and operating principle of the present invention will be described. In this embodiment, one unit cell (for storing one-bit information) is constituted from a first diffusion region 12A, a first insulating film 14A, a first floating gate 16A, a second insulating film 17A, a control gate 18A, a second insulating film 14C, and a selection gate 15. The first diffusion region 12A is provided in the surface of a substrate 11. The first insulating film 14A is provided in a first region on the substrate adjacent to the first diffusion region 12A. The first floating gate 16A is constituted from a conductive film provided on the first insulating film 14A and constitutes charge storage means. The second insulating film 17A is provided on the first floating gate 16A. The control gate 18A is constituted from a conductive film provided on the second insulating film 17A. The second insulating film 14C is provided in a second region on the substrate 11, adjacent to the first region. The selection gate 15 is constituted from a conductive film provided on the second insulating film 14C. A diffusion region (not shown) is included in a third region in a direction (a vertical direction of the drawing) in which the selection gate 15 on the surface of the substrate extends. The selection gate 15 extends, crossing the diffusion region in the third region through an insulating film. The control gate 18A is disposed, three-dimensionally crossing the selection gate 15.

Then, according to the embodiment of the present invention, preferably, another unit cell is disposed in line asymmetry with the one unit cell described above. That is, referring to FIG. 1 in terms of two unit cells for individually storing two-bit information, a two-bit cell is constituted from the first diffusion region 12A and a second diffusion region 12B provided in the surface of the substrate to be mutually apart, the first insulating film (tunnel insulating film) 14A provided in the first region on the substrate, adjacent to the first diffusion region 12A, the first floating gate 16A constituted from the conductive film provided on the first insulating film 14A and constituting a charge storage node (Node 1), the second insulating film 17A provided on the first floating gate 16A, the first control gate 18A constituted from the conductive film provided on the second insulating film 17A, the third insulating film 14C provided in the second region on the substrate 11, adjacent to the first region, the selection gate 15 constituted from the conductive film provided on the third insulating film 14C, a fourth insulating film (tunnel insulating film) 14B provided in a third region on the substrate adjacent to the second diffusion region 12B, a second floating gate 16B constituted from the conductive film provided on the fourth insulating film 14B and constituting a charge storage node (Node 2), a fifth insulating film 17B provided on the second floating gate 16B, and a second control gate 18B constituted from the conductive film provided on the fifth insulating film 17B. The first control gate 18A on the first floating gate and the second control gate 18B on the second floating gate are connected in common to constitute a word line electrode. The selection gate 15 extends in a direction orthogonal to the word line electrode (or in the direction vertical to the drawing), and has a third diffusion region (not shown) provided to cross the longitudinal direction of the selection gate 15.

In the present invention, for writing to a cell, the selected control gate 18A or 18B is set to a first positive voltage, a threshold voltage (Vt) (or Vt+α, α>0) is supplied to the selection gate of the selected cell, the third diffusion region is set to 0V, and a third positive voltage is applied to the bit line connected to the diffusion region closer to the floating gate of the target cell for writing. The third diffusion region is thereby made to be an electron source, so that electrons are injected (channel hot electron injection) into the floating gate of the cell through the insulating film (tunnel insulating film) over the channel. The writing is thus performed.

In the present invention, cell erasure is performed by applying a predetermined negative voltage to the control gate 18A or 18B, supplying a positive voltage to the selection gate 15 (supplying the positive voltage to the substrate), and removing electrons from the floating gate that constitutes the storage node.

In the present invention, cell reading is performed by applying a positive voltage to the third diffusion region, applying a positive voltage to the control gate 18A or 18B of a cell for reading, applying a voltage of 0V to the diffusion region closer to the floating gate of the cell for reading of the two-bit cell, and applying the positive voltage to the selection gate, thereby positioning the third diffusion region at a drain side.

In the present invention, when writing to the target storage node Node 1 (floating gate) of the two-bit cell is performed, the diffusion region in the extension side of the selection gate is made to be a source. Then, source-side injection is performed, thereby performing the writing to the target storage node Node 1 without the medium of the nontarget storage node Node 2. Stable write characteristics can be thereby obtained. More specifically, when the node of one unit cell of a two-bit cell constituting two unit cells that share the selection gate 15 is programmed, no channel current flows between the respective diffusion regions 12A and 12B of the two unit cells, so that the node of the other unit cell will not be programmed.

According to the present invention, when reading from the storage node is performed, the diffusion region in the extension side of the selection gate is made to be a drain. Reading from a target storage node is thereby performed without the medium of a nontarget storage node.

As described above, in the present invention, the two-bit cell can be functioned independently as two unit cells on which substantial writing or reading is performed for each bit. For this reason, a stable memory cell current can be secured.

Embodiments

Figure 2:
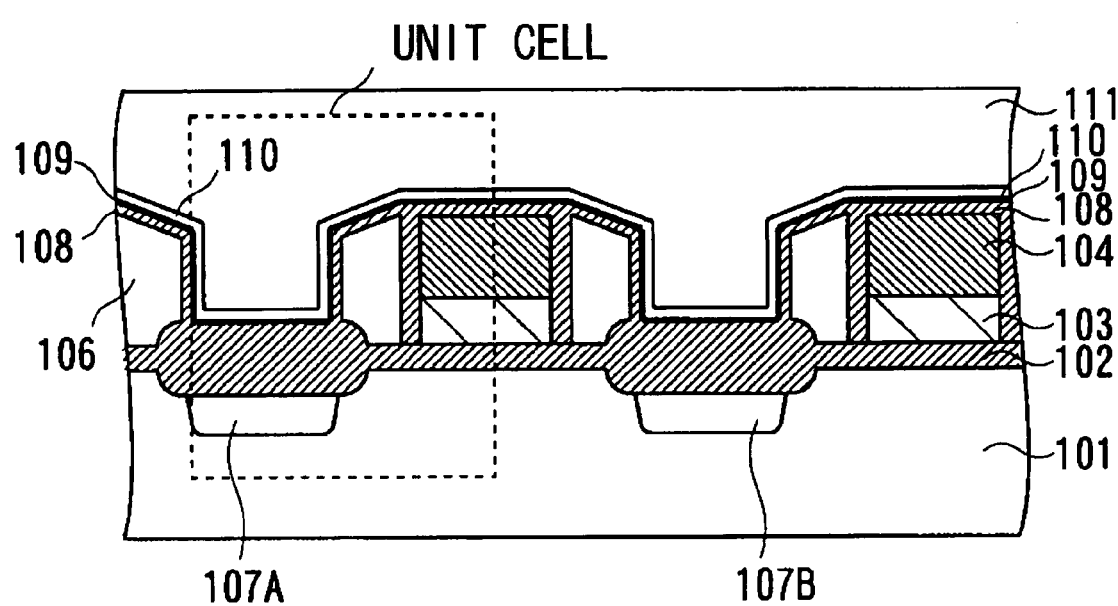
FIG. 2 is a diagram schematically showing a section of the cell in a memory array in the embodiment of the present invention.

In order to describe the above-mentioned invention in further detail, embodiments of the present invention will be described in detail with reference to drawings. FIG. 2 is a diagram schematically showing a section through an A-A line in FIG. 3 which schematically illustrates part of a layout configuration of the memory cell array according the first embodiment of the present invention.

Referring to FIG. 2, a pair of N+ diffusion regions 107A and 107B provided in the surface of a P-type silicon substrate 101 are disposed, extending in the surface of the substrate in a direction perpendicular to the drawing, thereby forming bit lines. (The N+ diffusion regions will be also referred to as "bit diffusion regions".) A silicon dioxide film 102 provided on the substrate between the pair of the N+ diffusion regions 107A and 107B, a selection gate electrode 103 constituted from a conductive film (such as polycrystalline-silicon) provided on the silicon dioxide film 102 are provided. On the selection gate electrode 103, a silicon dioxide film 104 is provided.

On side walls on both sides of a selection gate structure constituted from a multilayer of the silicon dioxide film 102, selection gate electrode 103, and silicon dioxide film 104, a control gate electrode 111 formed of a conductive film is provided through the silicon dioxide film 102, a floating gate electrode 106, and an insulating film (an ONO film constituted from a silicon dioxide film 108, a silicon nitride film 109, and a silicon dioxide film 110). Since the ONO film has a highly insulating property and a high dielectric constant, it is regarded to be suitable for thin film formation. Meanwhile, in the present invention, the insulating film disposed between the floating gate electrode 106 and the control gate electrode 111 is not of course limited to the ONO film.

The control gate electrode 111 extends in a direction orthogonal to the longitudinal direction of selection gate electrode 103 and three-dimensionally crosses the selection gate electrode 103. That is, the control gate electrode 111 contacts the upper surface of the silicon dioxide film 110 provided over the selection gate electrode 103 at a crossing with the selection gate electrode 103.

As shown by a dotted line in FIG. 2, one unit cell is constituted from one diffusion region 107A, the floating gate electrode 106, the control gate electrode 111, and a selection gate (constituted from the insulating film 102 and the selection gate electrode 103). The floating gate electrode 106 is constituted from a conductive film (such as polycrystalline-silicon) provided on the silicon dioxide film 102 (tunnel insulating film) on the substrate adjacent to the diffusion region 107A. The control gate 111 is provided over the floating gate electrode 106 through the insulating films 108, 109, and 110. Referring to FIG. 2, the control gate electrode 111 may of course have a configuration in which a metal silicide having a high melting point is provided on its polycrystalline-silicon surface, thereby having a low resistance.

In this embodiment, a two-bit cell is constituted by disposing two unit cells that are line symmetric with respect to a common single selection gate. That is, referring to FIG. 2, the other one of unit cells of the two-bit cell is constituted from one diffusion region 107B, the floating gate electrode 106 formed of the conductive film (such as polycrystalline-silicon), provided on the silicon dioxide film 102 (tunnel insulating film) on the substrate adjacent to the diffusion region 107B, the control gate electrode 111 provided over the floating gate electrode 106 through the insulating films 108, 109, and 110, and the selection gate (constituted from the insulating film 102 and the selection gate electrode 103).

Figure 3:
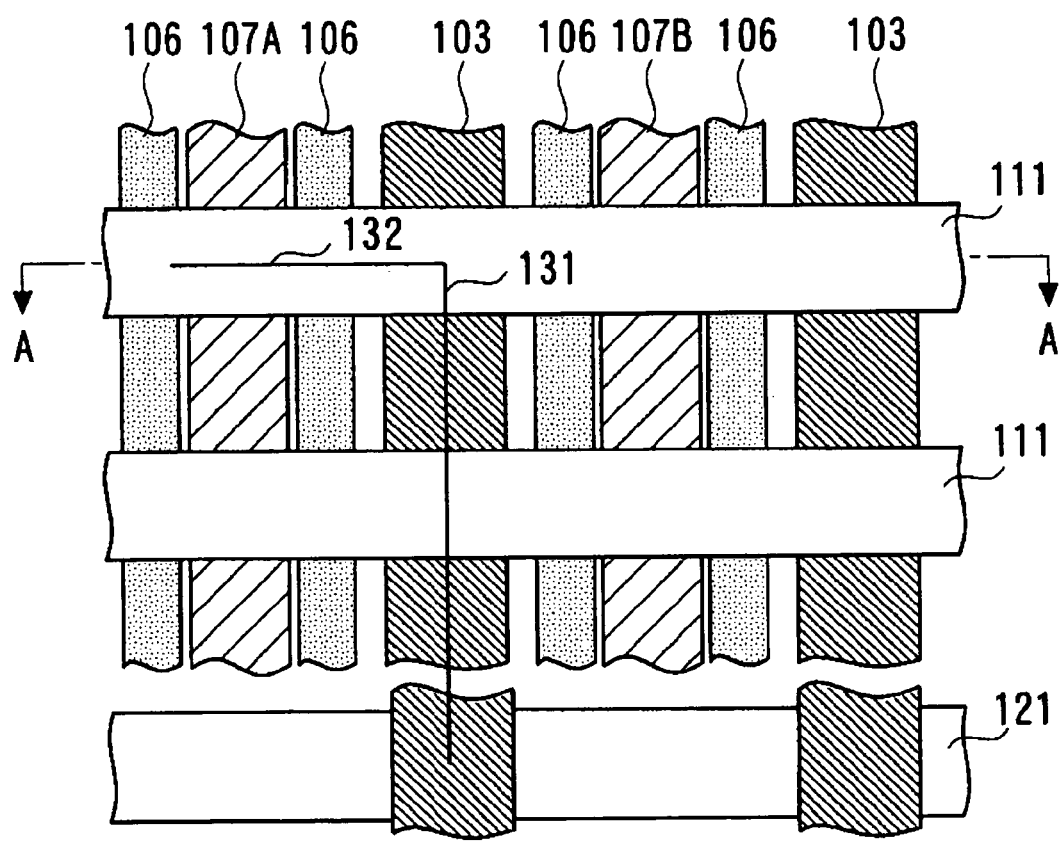
FIG. 3 is a diagram schematically showing a layout configuration of the memory cell array in the embodiment of the present invention.

As will be described later, when programming is performed by injecting electric charges (electrons) into the floating gate electrode 106 of a unit cell through the silicon dioxide film 102, a positive voltage is supplied to the diffusion region 107A that constitutes a drain, using a diffusion region 121 (which is also referred to as an "separate diffusion region" or "common source region") located at the extension of the selection gate electrode 103 as shown in FIG. 3, as a source or an electron supply source. Then, channel hot electrons are injected into the floating gate electrode 106 through the silicon dioxide film 102, using source-side injection.

In this embodiment, when programming the storage node of one unit cell of the two unit cells sharing the selection gate electrode 103, the storage node of the other unit cell is not programmed. This is because, in this embodiment, no channel current flows between the respective diffusion regions 107A and 107B of the two unit cells.

Referring to FIG. 3, there are provided in the substrate surface two diffusion regions 107A and 121 that become the source or the drain diffusion region of a cell transistor depending on the relationship with the selection gate electrode 103. A channel is formed in the surface layer of the substrate immediately below the selection gate electrode 103. The channel constitutes a passage connecting the diffusion region 107A and the diffusion region 121 which constitute the source and the drain. As shown in FIG. 3, when the substrate is seen from above, the channel has a shape that includes a first path 131 and a second path 132. The first path 131 extends from one diffusion region 121 in a direction (a longitudinal direction in FIG. 3) defined with respect to the planar shape of the selection gate electrode 103. The second path 132 extends from an end portion of the first path 131 to the other diffusion region 107A in a second direction at a predetermined angle (such as a right angle) with the first direction.

More specifically, according to the present invention, the current (channel current) flowing through the channel that constitutes the passage between the diffusion regions 121 and 107A that serve as the source and the drain flows in parallel to the selection gate electrode 103, and from below a location around the center of the conductor width of the selection gate 103, flows in a direction perpendicular to the selection gate electrode 103 (or in the longitudinal direction of the control gate electrode 111). On the other hand, as seen from the control gate electrode 111, the current (channel current) flowing through the channel that constitutes the passage between the diffusion region 107A and the diffusion region 121 flows in parallel to the control gate electrode 111, for example, and flows in a direction perpendicular to the longitudinal direction of the control gate electrode 111 (or in the longitudinal direction of the selection gate electrode 103).

Likewise, in regard to the other unit cell that constitutes the two-bit cell as well, the channel formed in the surface layer of the substrate immediately below the selection gate electrode 103 and forms a passage connecting the two diffusion regions 107B and 121 that constitute the source and the drain has a shape that includes a first passage and a second passage when the substrate is seen from above. The first path extends from the one diffusion region 121 in the longitudinal direction of the selection gate electrode 103. The second path extends from an end of the first path to the other diffusion region 107B in a second direction at the predetermined angle (right angle) with the first direction.

Next, an example of the manufacturing method of a semiconductor memory device according to an embodiment with reference to FIGS. 4 through 12, which are sectional views showing steps of the manufacturing method in the embodiment of the present invention in the order of manufacturing steps The silicon dioxide film 102 is formed over the P-type semiconductor substrate 101. The silicon dioxide film 102 is deposited to a thickness of approximately 10 nm, for example through thermal oxidation. Over the silicon dioxide film 102, polycrystalline-silicon 103 with a film thickness of approximately 100 nm, for example is formed (refer to FIG. 4A). Preferably, the polycrystalline-silicon is made to be an N-type using phosphorus-doped polycrystalline-silicon or a method of ion implantation of arsenic impurities, or the like. Further, preferably, the P-type semiconductor substrate 101 is made to have a necessary surface concentration by implantation of boron ions or the like. Incidentally, if the diffusion region 121 in FIG. 3 is set to a buried N+ diffusion region, for example, the diffusion region 121 is formed in the surface of the P-type semiconductor substrate 101 in advance. Although the diffusion region 121 in FIG. 3 is elongated in parallel along the longitudinal direction of the control gate electrode 111 as one body, this diffusion region 121 may be constituted by a plurality of diffusion regions which are separated each other and disposed along the longitudinal direction of the control gate electrode 111.

The silicon dioxide film 104 is formed over the polycrystalline-silicon 103 using a CVD (Chemical Vapor Deposition) method or the like. Then, using a photomask, the silicon dioxide film 104 and the polycrystalline-silicon film 103 are selectively removed to form the selection gates (refer to FIG. 4B).

Figure 4A:
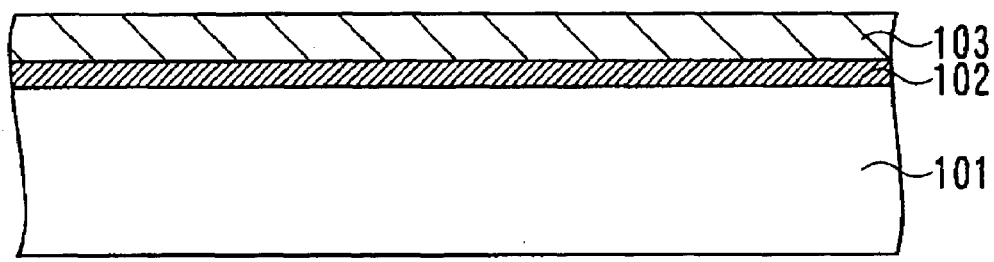
FIGS. 4A through 4C are diagrams explaining a manufacturing method in the embodiment of the present invention in the order of steps.
Figure 4B:
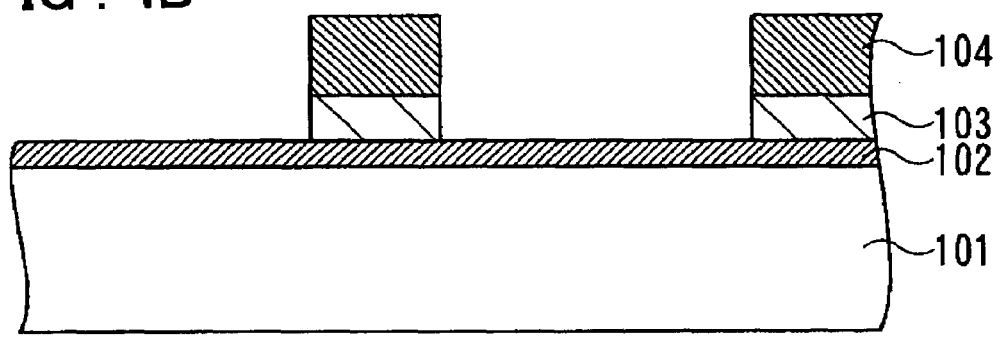
Figure 4C:
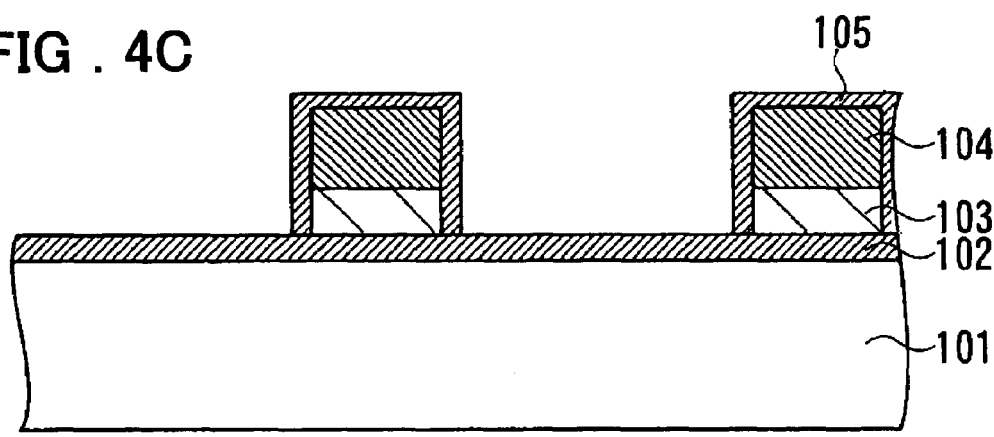

Thereafter, a silicon dioxide film 105 is formed over the entire surface of the substrate by the CVD or the thermal oxidation (refer to FIG. 4C).

Figure 5A:
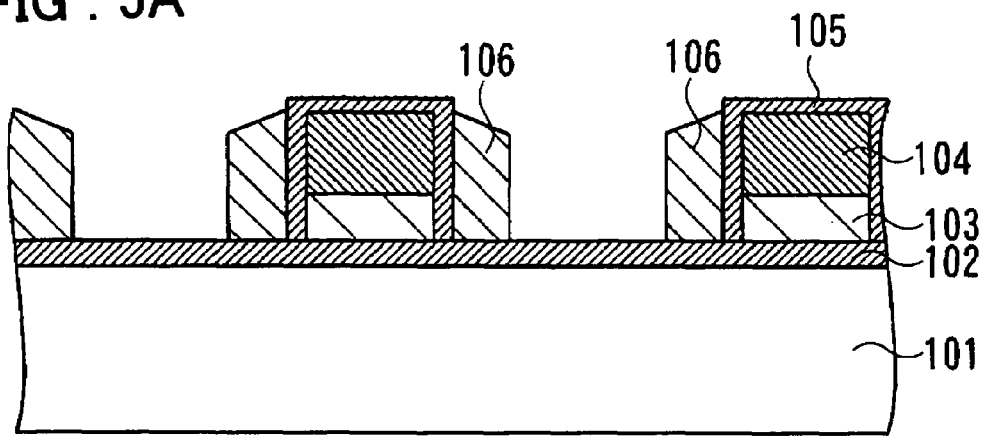
FIGS. 5A through 5C are diagrams explaining the manufacturing method in the embodiment of the present invention in the order of steps.

Next, a polycrystalline-silicon film is deposited over the entire surface of the substrate using the CVD method, and then, by etch back, the floating gate electrodes 106 in the form of side walls are formed on the side walls of the selection gates covered with the silicon dioxide film 105 (refer to FIG. 5A). Preferably, the polycrystalline-silicon film is of N type that includes impurities of phosphorus or arsenic. The width of the side walls is substantially equal to the thickness of the deposited polycrystalline-silicon film.

Figure 5B:
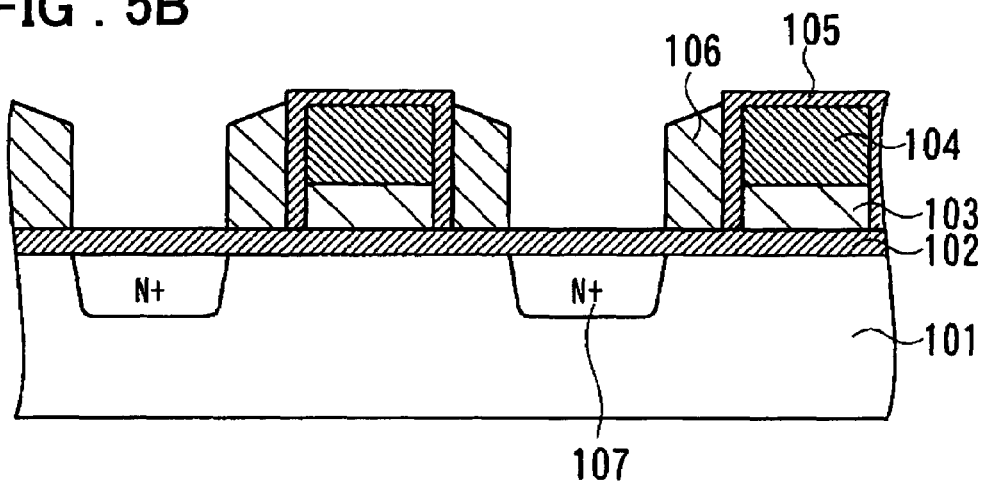

Next, using the formed selection gates and the formed floating gates as a mask, ion implantation is performed, thereby forming N+ diffusion regions (also termed as "N+ region") 107 in the surface of the substrate in a self-alignment manner (refer to FIG. 5B). Arsenic ions, for example, are implanted with a dose of $10^{15}$ cm$^{-2}$. After the ion implantation, annealing may be performed in a nitrogen atmosphere as necessary. During the arsenic ion implantation, a mask is provided over the region covering the buried N+ diffusion region (indicated by reference numeral 121 in FIG. 3).

Figure 5C:
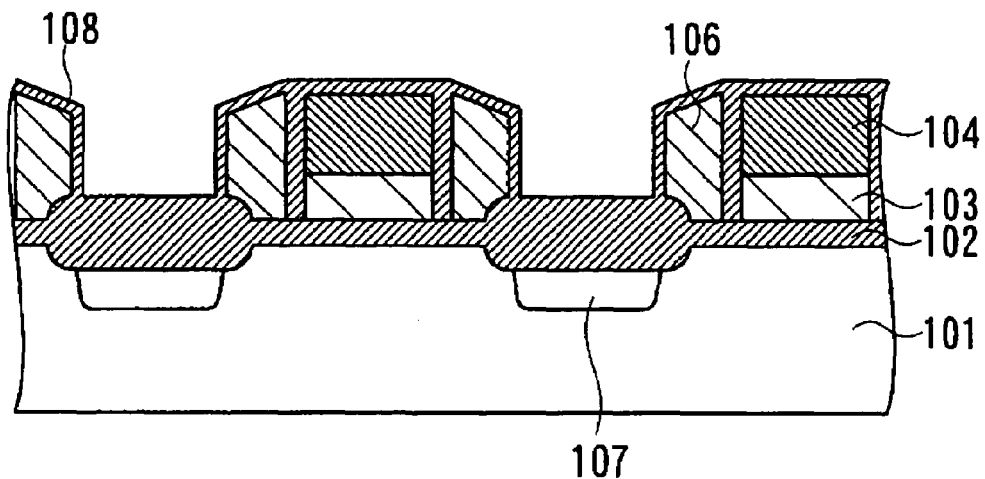

Then, the silicon dioxide film 108 is formed over the entire surface of the substrate by high-speed oxidation, for example (refer to FIG. 5C). The silicon dioxide film 108 that constitutes a bottom oxide film is formed to, be sufficiently thick. That is, since the speed of the oxidation increases (oxidation enhanced diffusion) due to high concentration impurities (of arsenic or the like, for example) in silicon, which is caused by thermal oxidation, the film thickness of the silicon dioxide film 108 over the diffusion regions 107 into which arsenic ions have been implanted increases as shown in FIG. 5). Alternatively, the silicon dioxide film 108 may also be formed by using CVD+EB (which is the CVD that uses a reaction in the surface of the substrate, induced by electronic beam radiation and is also referred to as "EBCVD").

Figure 6:
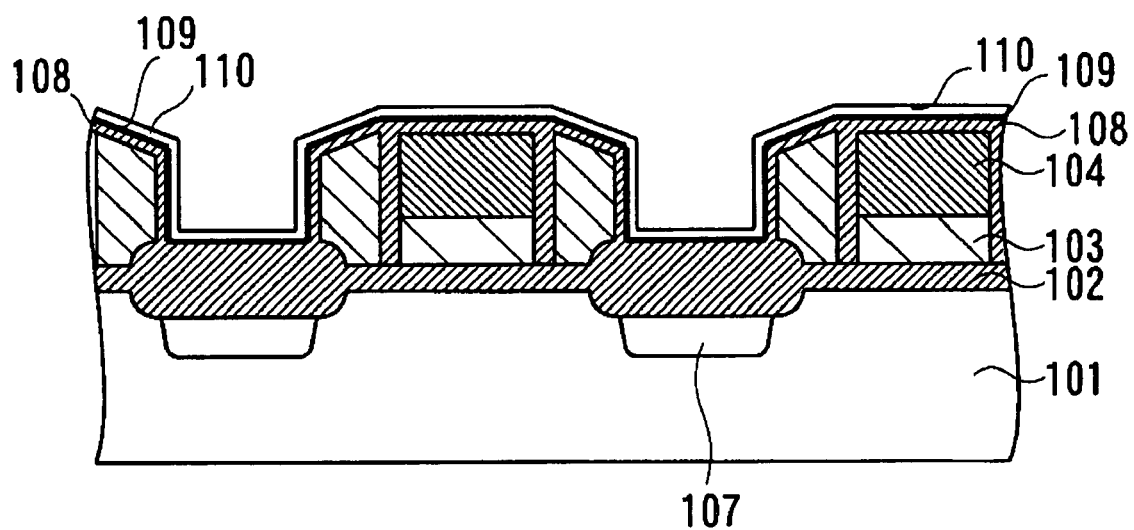
FIG. 6 is a diagram explaining the manufacturing method in the embodiment of the present invention in the order of steps.

Then, the silicon nitride film 109 is formed to cover the coated silicon dioxide film 108, and the silicon dioxide film 110 is formed over the silicon nitride film 109 (refer to FIG. 6).

Then, the polycrystalline-silicon film 111 is formed over the silicon dioxide film 110. Further, a low-resistance material such as WSi is coated over the upper surface of the polycrystalline-silicon 111 that constitutes word lines (refer to FIG. 7). Alternatively, a silicide process using a metal with a high-melting point can also be applied.

Figure 7:
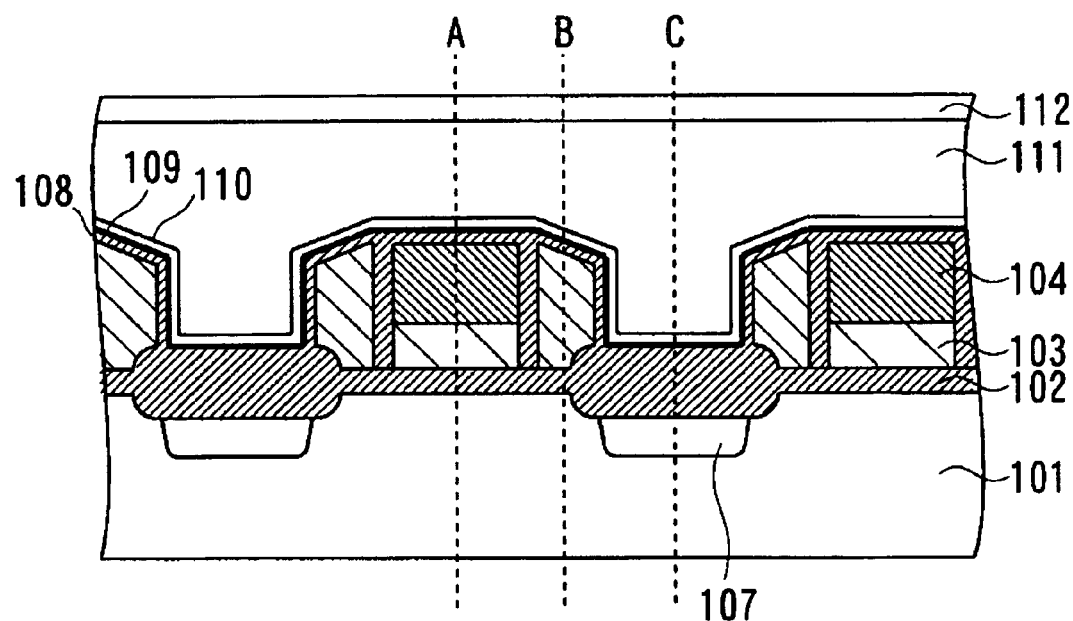
FIG. 7 is a diagram explaining the manufacturing method in the embodiment of the present invention in the order of steps.

FIGS. 8A-8C through FIGS. 12A-12C are diagrams sequentially showing manufacturing steps when the section of the substrate is seen along A, B, C lines in FIG. 7. Referring to respective drawings, A, B, C correspond to the selection gate, floating gate, and diffusion region, respectively.

Referring to FIGS. 8A, 8B and 8C, a photoresist 117 provided on WSi 112 serves for pattern formation of the word lines.

Figures 9A, 9B, 9C:
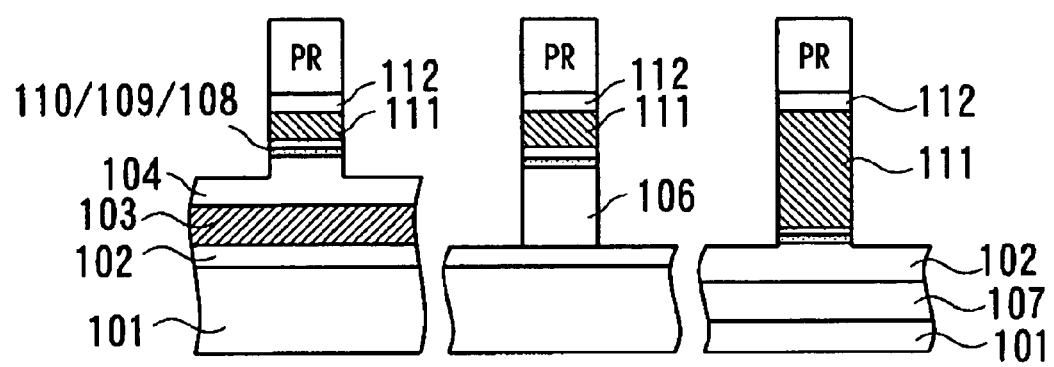
FIGS. 9A through 9C are diagrams explaining the manufacturing method in the embodiment of the present invention and schematically showing sections cut through the lines of A, B, and C in FIG. 6.

Using the photoresist 117 as a mask, the WSi 112 for which film formation was performed, the polycrystalline-silicon 111, and the ONO film (110, 109, and 108) are selectively removed to form the control gates, by a dry etching method, for example (refer to FIGS. 9A, 9B and 9C). That is, with the silicon dioxide film 104 as a stopper, pattern formation is performed, using etching. Then, the photoresist 117 is removed.

Then, a memory array region is covered with a mask so as to create peripheral gates (not shown) (to create an LDD (Lightly Doped Drain) region, for example) for the memory array region. Thereafter, the mask is removed, and side walls 113 of the silicon dioxide film are formed on both sides of the control gate electrodes 111 in the longitudinal direction. Then, an inter-layer insulating film 114 is formed (refer to FIGS. 10A, 10B and 10C). Then, source and drain diffusion regions of the peripheral gates are created.

Then, as shown in FIG. 11C, contact holes 115 that reach the WSi 112 are formed.

Figures 12A, 12B, 12C:
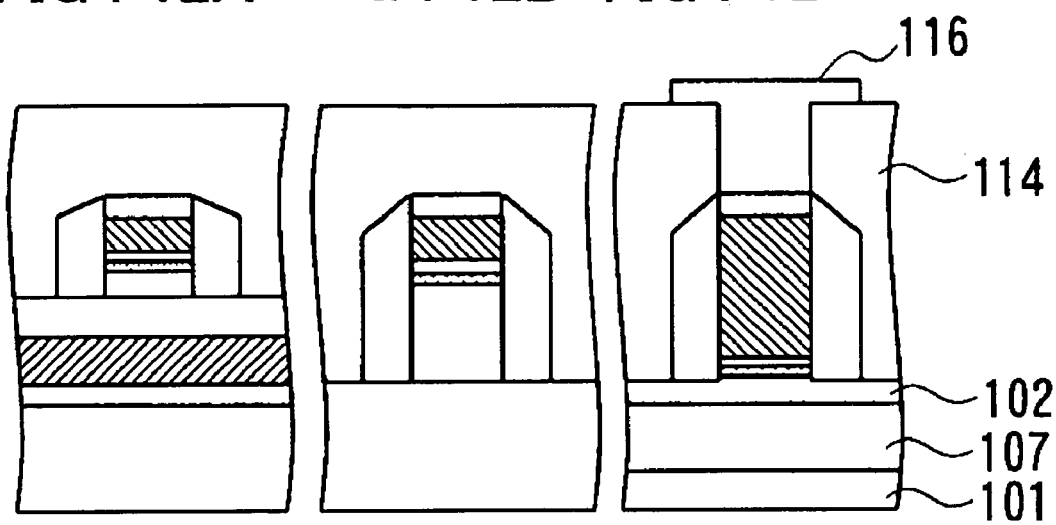
FIGS. 12A through 12C are diagrams explaining the manufacturing method in the embodiment of the present invention and schematically showing sections cut through the lines of A, B, and C in FIG. 6.

Thereafter, Al interconnection pattern 116 is formed for the contact hole 115 (refer to FIG. 12C).

Next, a configuration of the memory cell array according to the embodiment of the present invention will be described.

Figure 13:
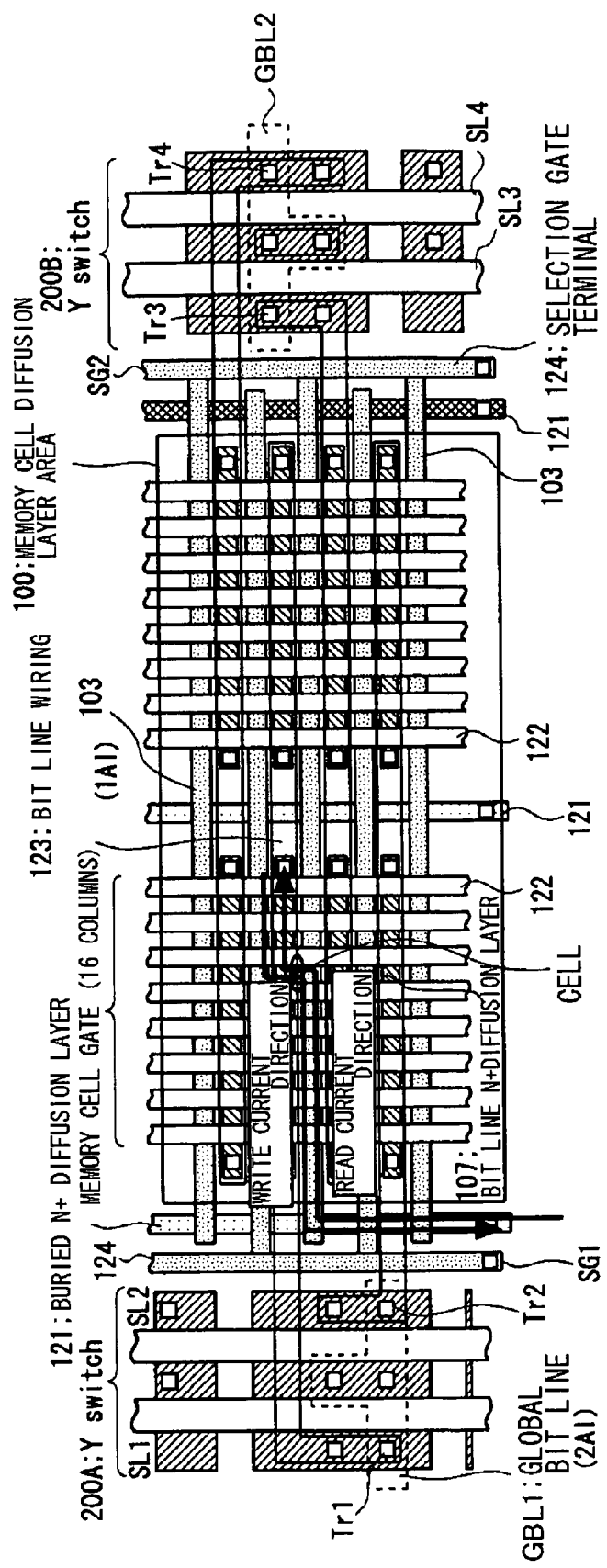
FIG. 13 is a diagram showing a configuration of the memory cell array in the embodiment of the present invention.

Referring to FIG. 13, a plurality of columns of the N+ diffusion regions 107, which are also referred to as the "bit diffusion regions), extending in one direction of the surface (surface layer) of the substrate, disposed to separate to each other, and connected to the bit lines by contacts are provided for the memory cell array in this embodiment. The buried N+ diffusion regions 121 (each corresponding to the region 121 in FIG. 3) extending in a direction orthogonal to the one direction are provided in positions separated from both ends of the plurality of columns of the diffusion regions in the longitudinal direction. A plurality of word line electrodes 122 provided over the substrate through the insulating films (not shown) and extending in a direction orthogonal to the longitudinal direction of the diffusion regions 107 are provided. The selection gate electrodes 103 provided over the substrate through the insulating film (not shown) and extending in the one direction between the columns of the diffusion regions 107 are provided. The selection gate electrodes 103 three-dimensionally cross the buried N+ diffusion regions 121 through the insulating film (not shown).

In an example shown in FIG. 13, Y switches ("selection transistors" or "bank selection transistors") 200A and 200B are provided on both sides of a memory cell diffusion region area 100 (also referred to as a "memory cell area").

The Y switch 200A includes first and second selection transistors Tr1 and Tr2. Each one of their diffusion regions that will become the source or the drain is connected to a global bit line GBL1 disposed in a second aluminum interconnection layer through a contact/via hole. The gate electrodes of the transistors Tr1 and Tr2 are made to be selection lines SL1 and SL2, respectively. The other diffusion regions of the transistors Tr1 and Tr2 that will respectively become the drain or the source are connected to corresponding bit lines 123 provided in a first aluminum interconnection layer through contacts.

The Y switch 200B includes third and fourth selection transistors Tr3 and Tr4. Each one of their diffusion regions that will become the source or the drain is connected to a global bit line GBL2 disposed in the second aluminum interconnection layer through a contact/via hole. The gate electrodes of the transistors Tr3 and Tr4 are made to be selection lines SL3 and SL4, respectively. The other diffusion regions of the transistors Tr3 and Tr4 that will respectively become the drain or the source are connected to corresponding bit lines 123 in the first aluminum interconnection layer through contacts. The diffusion regions 107 in the surface of the substrate are connected to corresponding bit lines 123 in the first aluminum layer through contacts.

Second and fourth bit lines connected to the first and second selection transistors Tr1 and Tr2 extend from the Y switch 200A to the Y switch 200B through the memory cell area 100, while first and third bit lines connected to the third and fourth selection transistors Tr3 and Tr4 extend from the Y switch 200B to the Y switch 200A through the memory cell area 100.

In the example shown in FIG. 13, in the memory cell array, every eight word line electrodes 122 constitute one group, and two groups are provided. Incidentally, the configuration of the memory cell array in the present invention is not of course limited to the configuration of the two groups each including eight word lines.

The buried N+ diffusion regions 121 are provided on both sides of the groups of the word line electrodes 122. Three buried N+ diffusion regions 121 are provided for the two groups of the word line electrodes 122. By providing the buried N+ diffusion regions 121 on both sides of the respective groups (subarrays) of the memory cell array, a read current is increased, as will be described later.

The selection gate electrodes 103 disposed between the diffusion regions 107 are alternately connected to two selection gate terminals 124 (SG1 and SG2) disposed on both sides of the memory cell area 100. The first and second selection gate terminals SG1 and SG2 disposed on both sides of the memory cell area 100 and the selection gate electrodes 103 in the memory cell area 100 are formed of the same electrically conductive material, and simultaneously pattern-formed in the manufacturing step in FIG. 4B. In the layout shown in FIG. 13, the first and second selection gate terminals SG1 and SG2 are disposed between the Y switch 200A and the buried N+ diffusion region 121 in one side of the memory cell area 100 and between the Y switch 200B and the buried N+ diffusion region 121 in the other side of the memory cell area 100, respectively, in parallel to the longitudinal direction of the word lines 122. From the first selection gate terminal SG1, the selection gate electrodes 103 extend in the areas between the diffusion regions 107 to the second selection gate terminal SG2 across the ends of the memory cell area 100 and the buried N+ diffusion regions 121, while from the second selection gate terminal SG2, the selection gate electrodes 103 extend in the areas between the diffusion regions 107 to the first selection gate terminal SG1 beyond the ends of the memory cell area 100 and the buried N+ diffusion regions 121. Meanwhile, referring to FIG. 13, the N+ diffusion regions 121 are not of course limited to the diffusion regions of a buried type.

Figure 14:
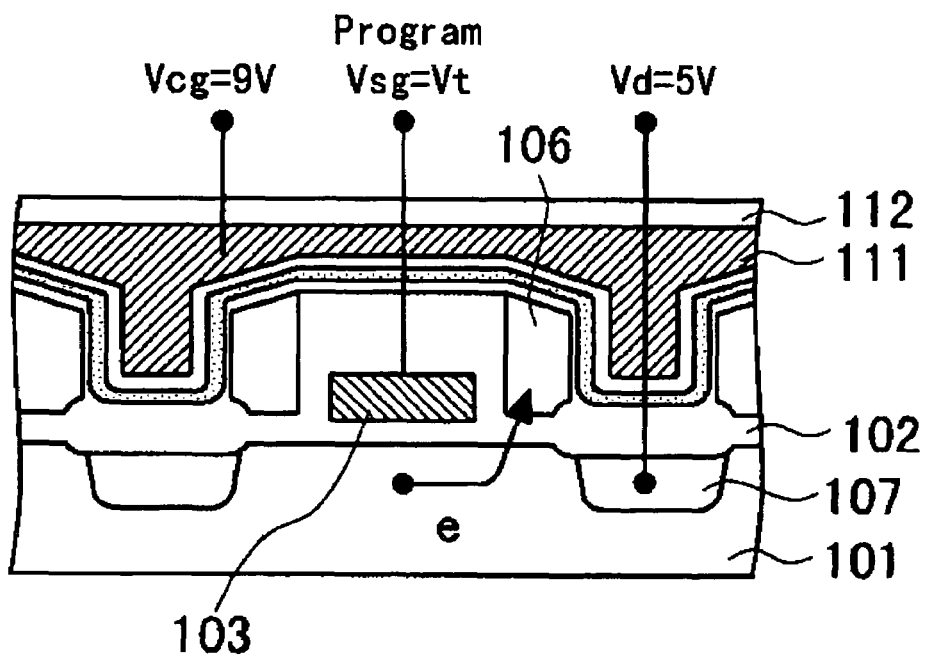
FIG. 14 is a diagram showing biases and an operation at the time of programming in the memory array in the embodiment of the present invention.

Next, a program operation according to the embodiment of the present invention will be described. FIG. 14 is a diagram for explaining the program operation on the node (floating gate) of a selected cell. An electron flow (opposite to the arrow line in FIG. 13 indicating the direction of a write current) when the word line 122 corresponding to a cell (indicated by CELL in FIG. 13) is selected and writing to the floating gate between the diffusion region 107 for the bit line 123 and the selection gate electrode 103 is performed in the configuration illustrated in FIG. 13 is shown.

Referring to FIGS. 13 and 14, a write voltage of 5V is applied to the diffusion region 107 (bit line BL2) (Vd=5V), a voltage Vt or Vt+α (where Vt is the threshold voltage, and α≧0) is applied to the selection gate electrode 103 (Vsg=Vt), and a selected word line W5 (control gate electrode) is set to 9V (Vcg=9V).

Electrons (hot electrons) e used for a write run from the buried N+ diffusion region 121 through the channel region immediately below the selection gate electrode 103, and are injected into the floating gate electrode 106 through the silicon dioxide film (tunnel oxide film) 102 immediately under the floating gate.

Figure 17:
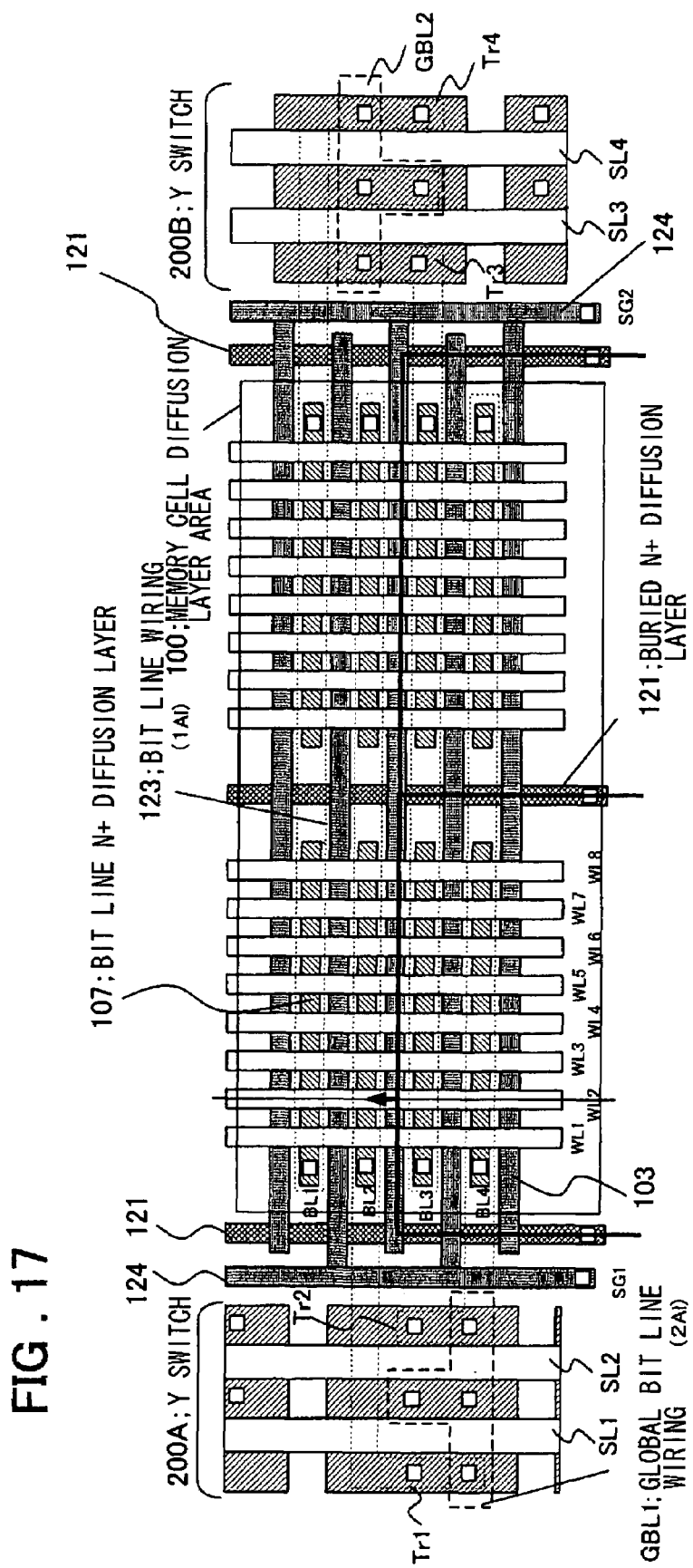
FIG. 17 is a diagram showing a program operation in the memory array in the embodiment of the present invention.
Figure 18:
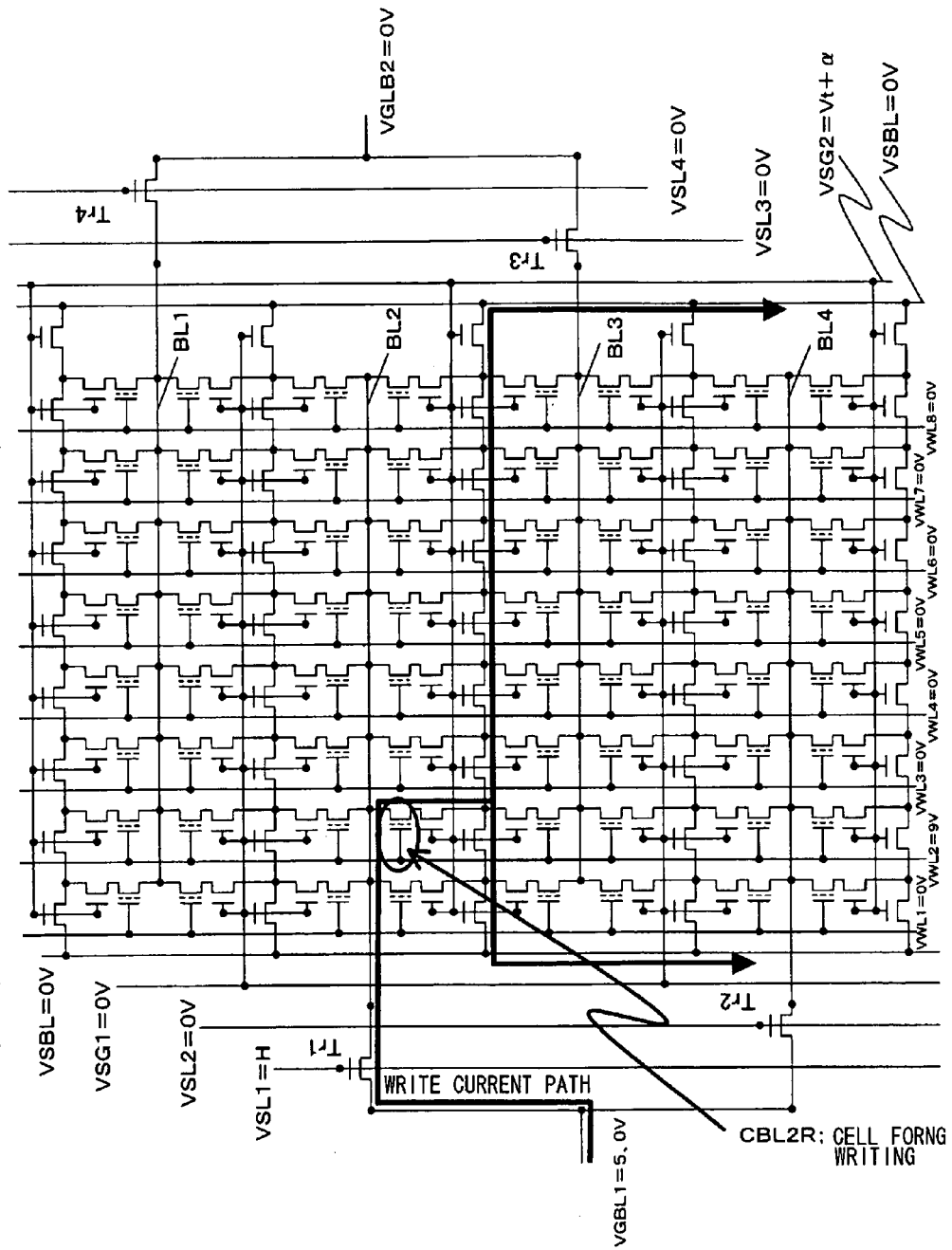
FIG. 18 is a diagram illustrating the configuration of FIG. 17 showing the program operation in the embodiment of the present invention in the form of an equivalent circuit.

FIGS. 17 and 18 respectively show the path of the write current and the memory cell array in the form of an equivalent circuit when writing to a cell (one of the unit cells of the two-bit cell) selected by a word line (WL2) and the bit line (BL2) is performed in FIG. 13.

The path of the write current is connected from the global bit line GBL1 to the bit line BL2 through a selection transistor Tr1, approximately 5V is applied to the drain of the cell (transistor) for writing connected to the selected word line WL2 (VWL2=9V), and the diffusion region on the side of the source of the cell transistor is connected to the buried N+ diffusion region 121 through the channel immediately below the selection gate electrode 103.

The write current flows from the cell for writing into three buried N+ diffusion regions 121 (having a voltage VSBL of the buried N+diffusion regions 121 set to 0V) through the channel for the selection gate. More specifically, electrons are injected into the cell for writing by source-side injection from the N+ diffusion regions 121 on right and left sides of the memory cell diffusion layer area 100 and the buried N+ diffusion region 121 in the middle of the memory cell diffusion layer area 100, in FIG. 17.

In the equivalent circuit shown in FIG. 18, floating gate transistors in which the control gate electrodes are connected to the word lines and selection transistors having the selection gates 103 as their gate electrodes are included. The channel structure below the selection gates is shown by eight columns of pass transistors connected in series between the buried N+ diffusion regions 121 (where the VSBL is set to 0V), having the selection gates 103 as the gate electrodes.

VGBL1 indicates the voltage of the global bit line GBL1 and is set to 5V.

VSL1 indicates the voltage of the bank selection line SL1 connected to the gate of the Y switch (selection transistors) Tr1 connected to the bit line BL2 and at a high level. The voltage VGBL1 of the global bit line GBL1 of 5V is supplied to the bit line BL2 through the transistor Tr1 in an on state.

VSG1 and VSG2 indicate the voltages of the selection gate terminals SG1 and SG2, respectively, and VSG1 is set to 0V, while VSG2 is set to Vt (or Vt+α).

VSL2 is the voltage of the selection line SL2 connected to the gate of the Y switch (selection transistors) Tr2 and is at a low level (indicating unselection).

VSBL indicates the voltage supplied to the buried N+ diffusion layers 121 and is set to 0V.

VGBL2 indicates the voltage of the global bit line GBL2 and is set to 0V (indicating unselection).

VSL3 indicates the voltage of the selection line SL3 and is at the low level, while VSL4 is the voltage of the selection line SL4 and is at the low level.

The path of the write current is connected from the global bit line GBL1 to the bit line BL2 through the selection transistor Tr1, approximately 5V is applied to the cell (transistor) for writing connected to the selected word line WL2 (where the VWL2 is set to 9V), and the diffusion region on the side of the source of the cell transistor is connected to the buried N+ diffusion regions 121 through the pass transistors connected in common to the selection gate terminal SG2.

The current flows to the buried N+ diffusion layers 121 on both sides of the memory cell region, where the voltage VSBL is set to 0V, through the channel for the selection gates. It means that electrons are injected from the buried N+ diffusion layers 121 on both sides to the cell for writing through source-side injection.

Figure 15:
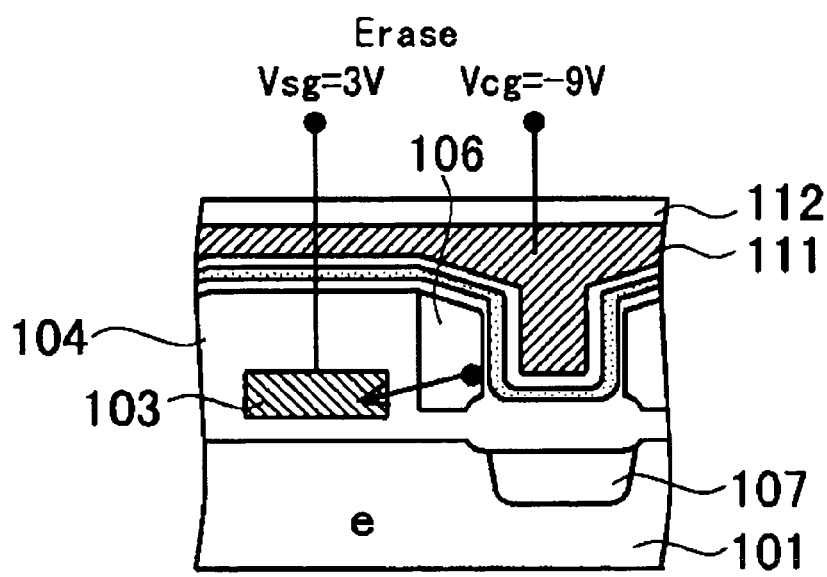
FIG. 15 a diagram showing biases and an operation at the time of erasure in the memory array in the embodiment of the present invention.

Next, an erase operation in the memory cell array according to the embodiment of the present invention will be described. FIG. 15 is a diagram for explaining the erase operation in the embodiment of the present invention.

In the embodiment of the present invention, erasure can be performed by one operation. More specifically, by applying a voltage of −9V to the word line and an erasure voltage of 3V to the selection gate electrode 103, electrons in the floating gate electrode 106 move to the selection gate.

Figure 16:
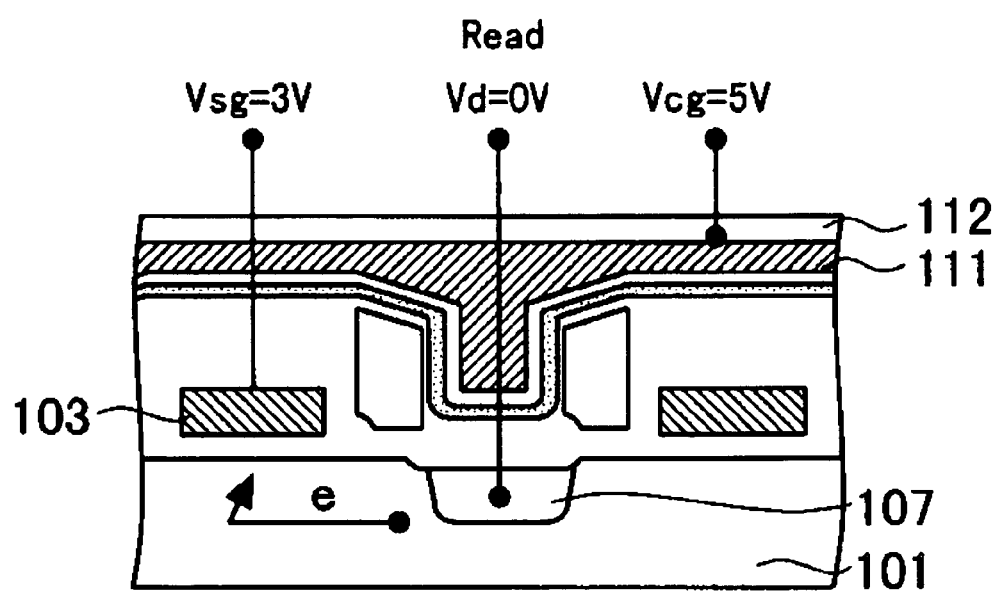
FIG. 16 is a diagram showing biases and an operation at the time of reading in the memory array in the embodiment of the present invention.

Next, a read operation in the memory cell array in the embodiment of the present invention will be described with reference to FIG. 16.

A read voltage Vread of 1V, for example is applied to the buried N+ diffusion regions 121. A voltage of 3V is applied to the selection gate electrode 103 of a cell for reading, a voltage of 0V is applied to the drain diffusion region of the cell for reading, and the word line (control gate) for selecting the cell for reading is set to 5V.

Figure 19:
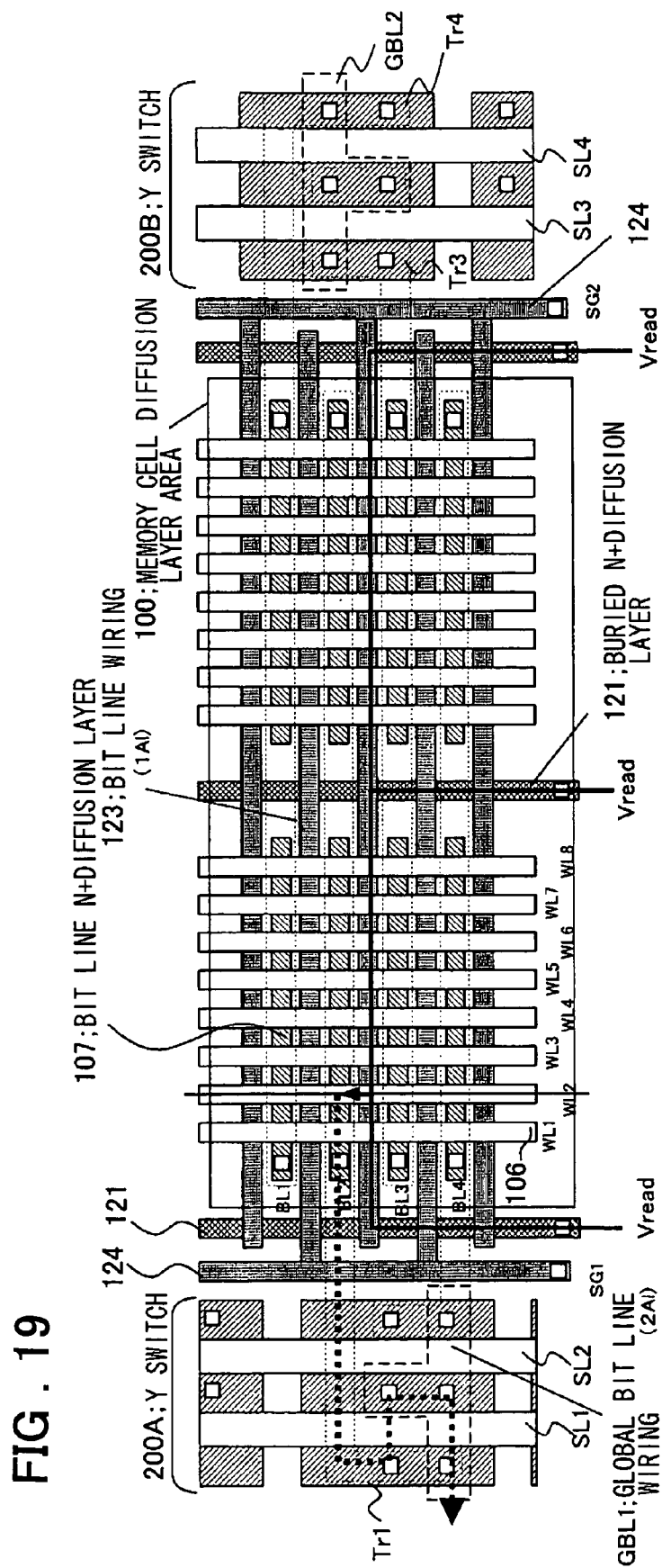
FIG. 19 is a diagram showing a read operation in the memory array in the embodiment of the present invention.
Figure 20:
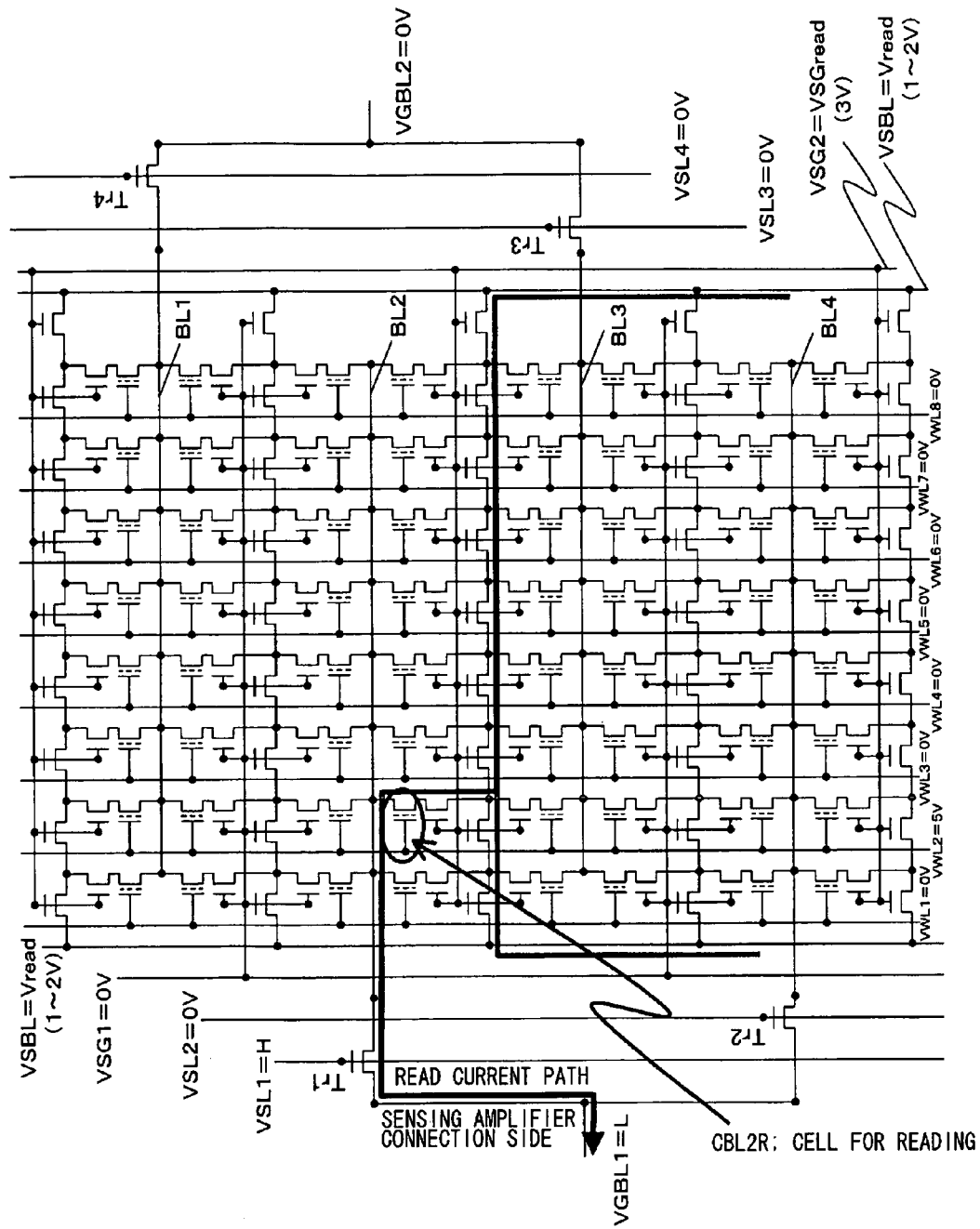
FIG. 20 is a diagram illustrating the configuration of FIG. 19 showing the read operation in the embodiment of the present invention in the form of an equivalent circuit.

FIGS. 19 and 20 respectively show the path of the read current and the equivalent circuit of the memory cell array when reading from a cell connected to the word line WL2 and the bit line BL2 is performed. The read current from the cell selected by the word line WL2 and connected to the bit line BL2 (or the path of the current from the bit line to the global bit line through the selection transistor) is shown.

A voltage of approximately 3V is applied to the second selection gate terminal SG2 (or VSG2 is set to 3V). The first selection gate terminal SG1 is set to 0V (indicating unselection). A voltage of 0V is applied to the bit line BL2, and the diffusion region 107 is set to 0V. To the word line WL2 (control gate), a voltage of 5V, for example, is applied (or the VWL2 is set to 5V).

When the threshold voltage of the selected cell is written to 5V or more, the channel immediately below the storage node is in an off state. Thus, the channel current does not flow.

When the writing is not performed on the selected cell, the channel is turned on, the channel current flows to a sensing circuit (sense amplifier) not shown through the path indicated by a dotted line in the drawing or the path of the current from the bit line BL2 to the global bit line GBL1 through a selection transistor Tr1 in the on state.

When reading is performed using the buried N+ diffusion regions 121 as the drains, a leakage current might be accidentally detected if the sensing circuit not shown is connected to the drain side of the memory cell. Connection to the source side of the memory cell as in this embodiment enables reading with higher sensitivity.

On the other hand, by setting the selection gate electrode (connected to the selection gate terminal SG1) adjacent to the selection gate electrode 103 (connected to the selection gate terminal SG2) of the cell for reading to 0V, no leakage current to the adjacent bit line flows. The design of the circuit is thereby facilitated.

FIG. 20 shows the memory cell array in FIG. 19 in the form of an equivalent circuit, and is a diagram for explaining the read operation from the cell.

The voltage VGBL1 of the global bit line GBL1 is at the low level.

The voltage VSL1 of the selection line SL1 connected to the gate of the bank selection transistor Tr1 connected to the bit line BL2 is at the high level. VSL2 indicates the voltage of the selection line SL2 connected to the gates of the selection transistors Tr2 and is set to 0V (indicating unselection).

The VSG1 and VSG2 indicate the voltages of the selection gate terminals SG1 and SG2, respectively.

The VSBL indicates the voltage supplied to the buried N+ diffusion layers 121 and is the Vread set to 1 to 2V.

The selected word line WL2 is set to 3V (VWL2=5V).

The VGBL2 indicates the voltage of the global bit line GBL2 and is set to 0V. The VSL3 indicates the voltage of the selection line SL3 and is set to 0V, while the VSL4 indicates the voltage of the selection line SL4 and is set to 0V.

The channel current flows from the buried N+ diffusion layers to the selected cell through the channel for the selected gate. When the writing is not performed on the storage node, the read current flows to the global bit line in the second aluminum interconnection layer through the bit line.

Figure 21:
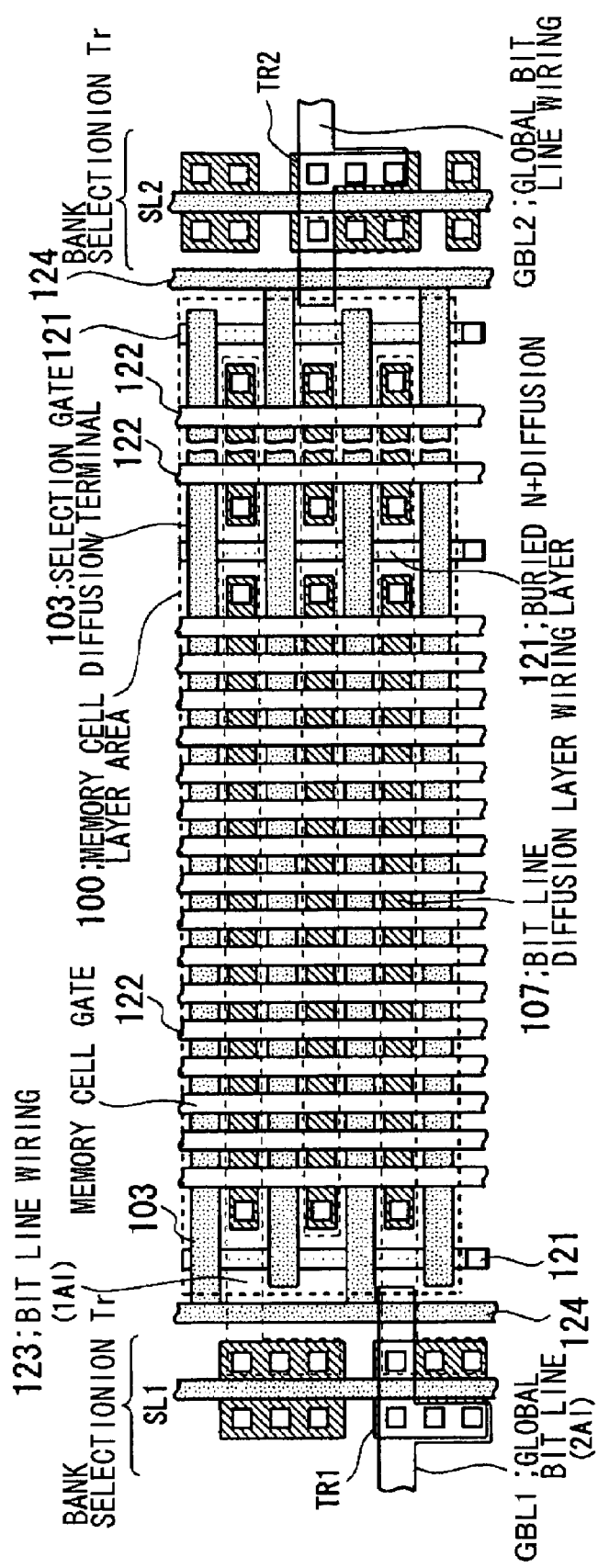
FIG. 21 is a diagram showing a configuration of a memory array according to other embodiment of the present invention.
Figure 22:
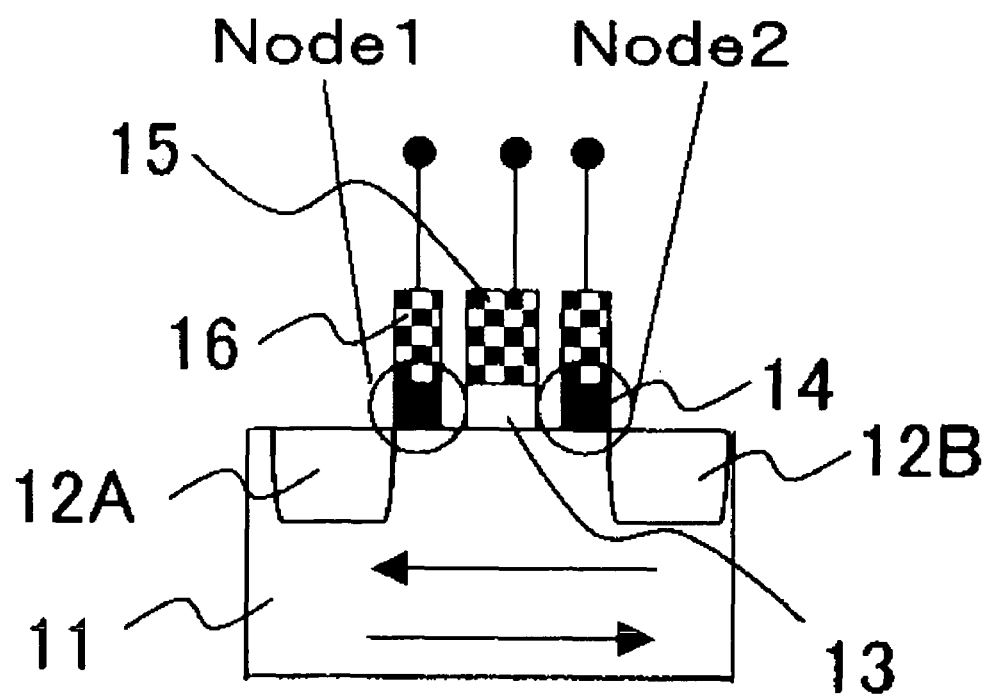
FIG. 22 is a diagram showing a conventional memory for storing two bits per cell.
Figure 23:
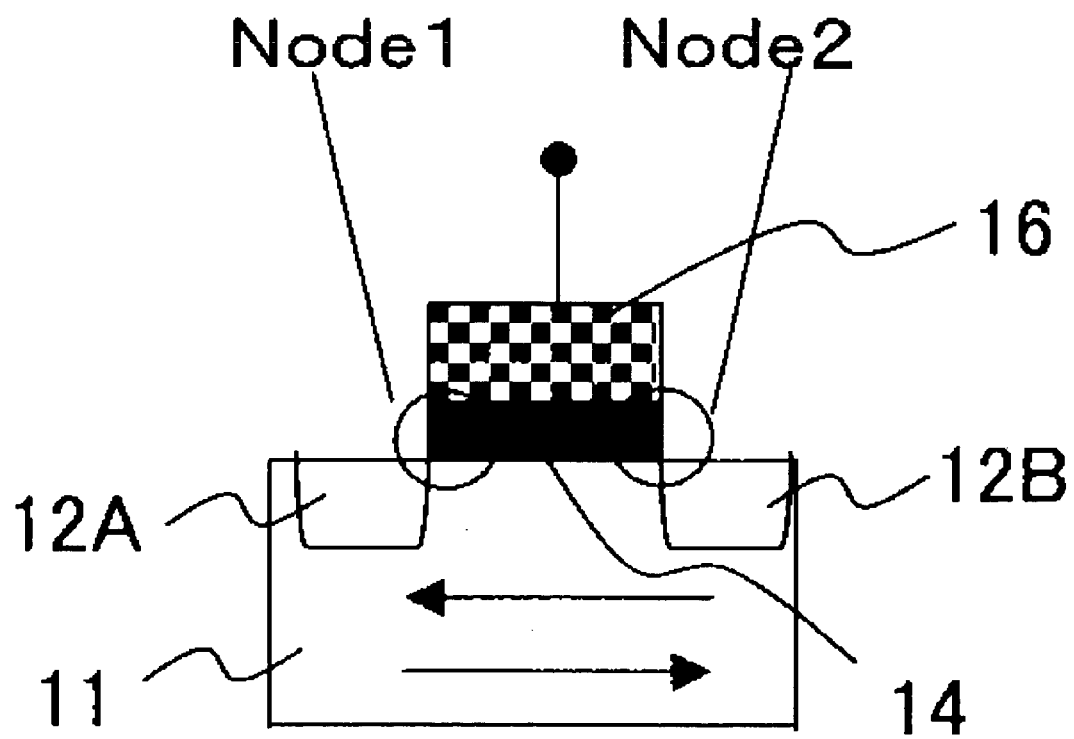
FIG. 23 is a diagram showing a conventional memory for storing two bits per cell.
Figure 25A:
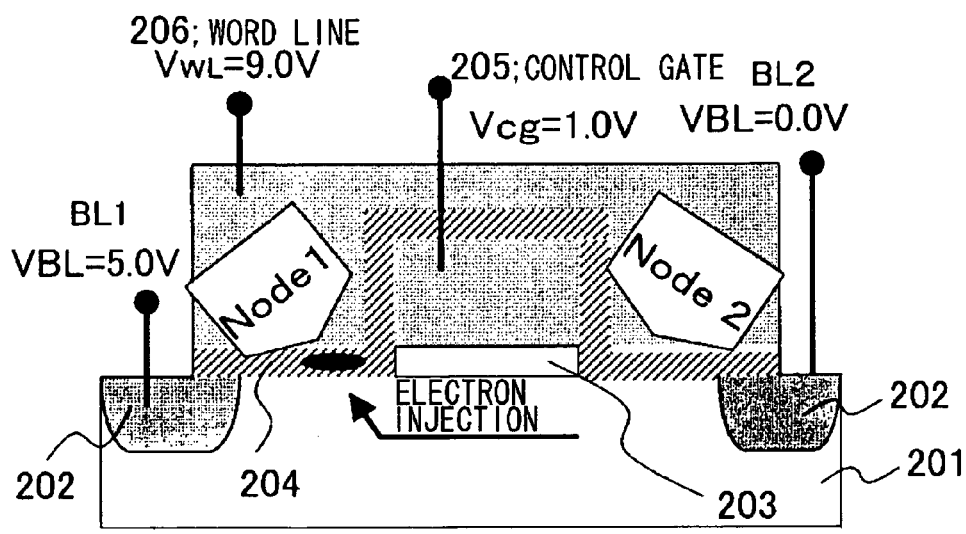
FIGS. 25A and 25B includes diagrams for explaining the problem of the conventional art.
Figure 25B:
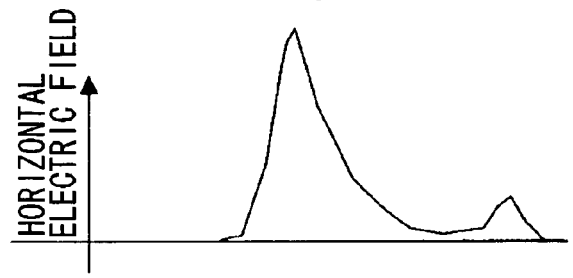
Figure 26:
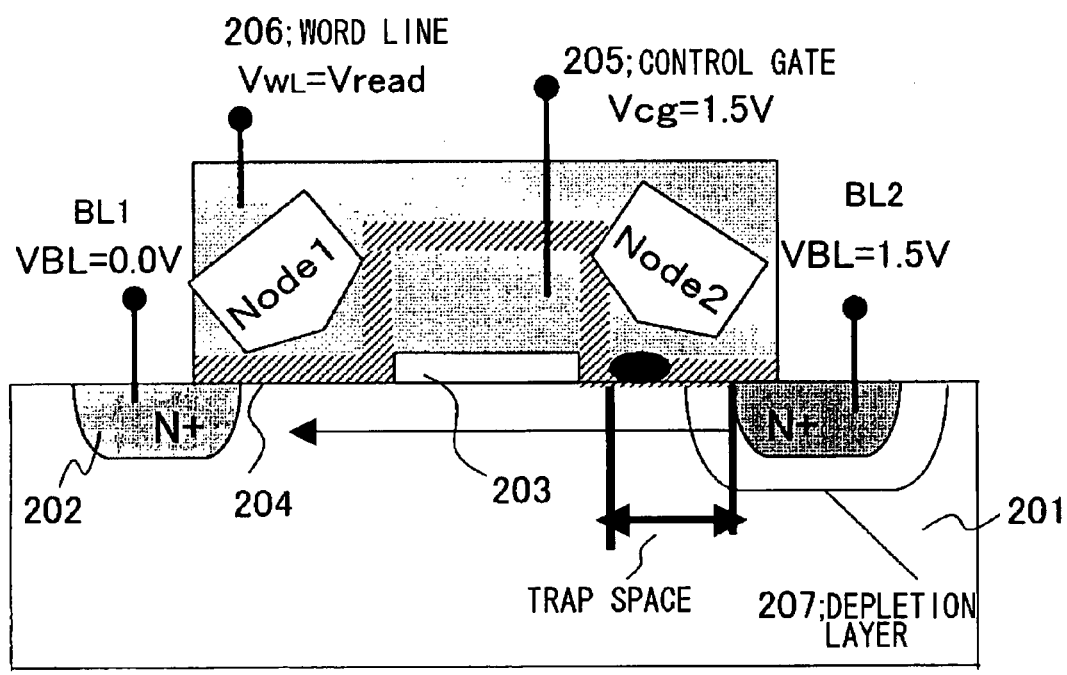
FIG. 26 is a diagram for explaining the problem of the conventional art.
Figure 27A:
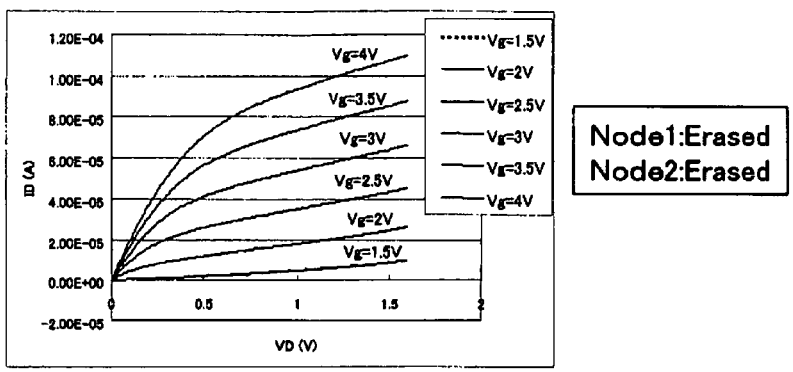
FIGS. 27A through 27C are measured drawings showing relationships between a trap space and a channel current.
Figure 27B:
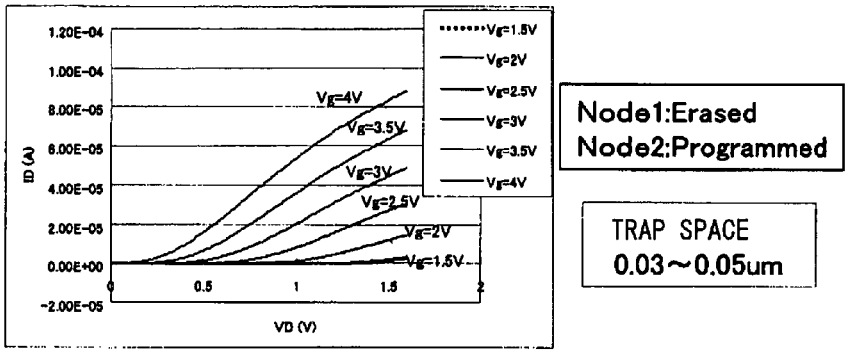
Figure 27C:
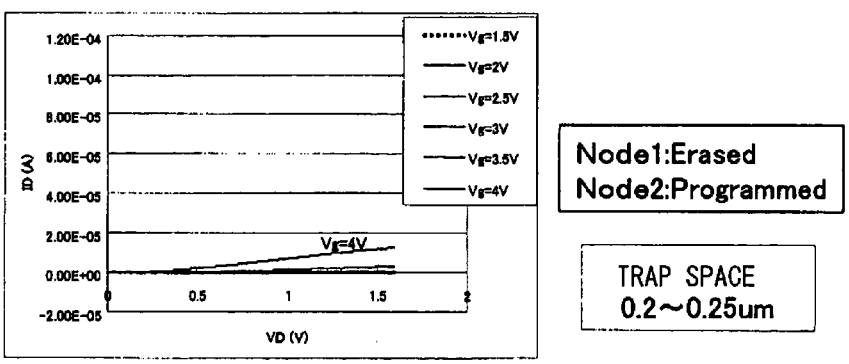
Figure 28:
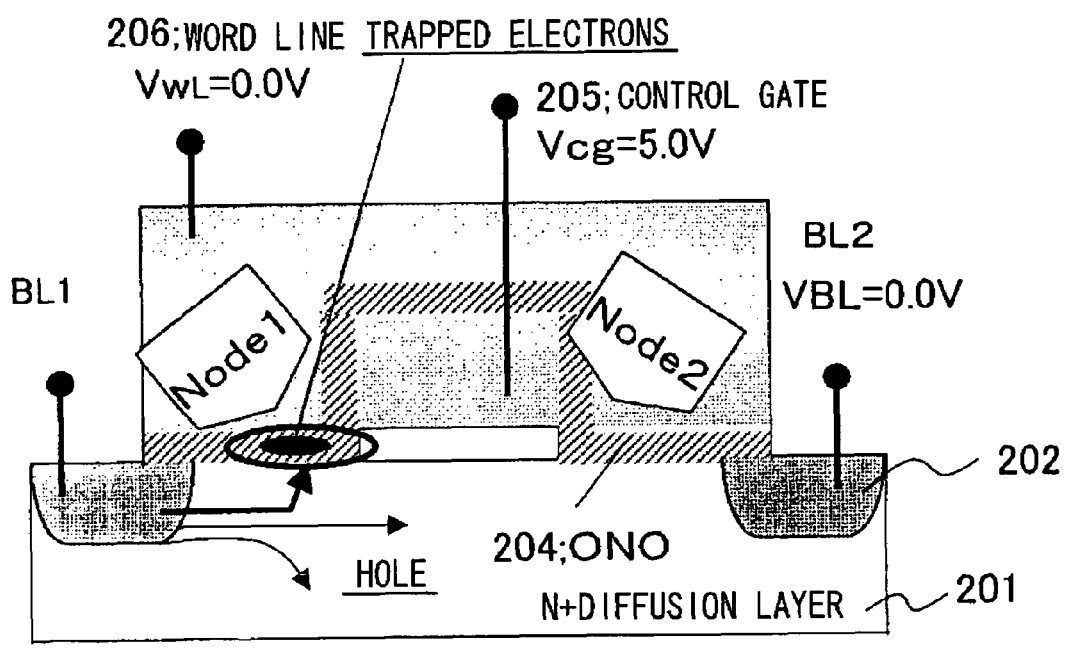
FIG. 28 is a diagram for explaining the problem of the conventional art.

FIG. 21 is a diagram showing a memory cell array according to other embodiment of the present invention. As shown in FIG. 21, a plurality of the word lines 122 are provided between the selection transistors in this embodiment. In this embodiment, the first selection line SL1 and the second selection line SL2 are provided. The first selection line SL1 is provided on one side of the memory cell diffusion layer area 100 and constitutes the gate electrodes for the Y switch (selection transistors) Tr1 for controlling connection between the global bit line GBL1 in the second aluminum interconnection layer and the bit line 123 in the first interconnection layer. The second selection line SL2 is provided on the other side of the memory cell diffusion layer area 100 and constitutes the gate electrode for the Y switch (selection transistors) Tr2 for controlling connection between the global bit line GBL2 in the second aluminum interconnection layer and the bit line 123 in the first interconnection layer. The first election line SL1 is connected in common to a plurality of the selection transistors on the one side, while the second selection line SL2 is connected in common to a plurality of selection transistors on the other side.

Figure 29:
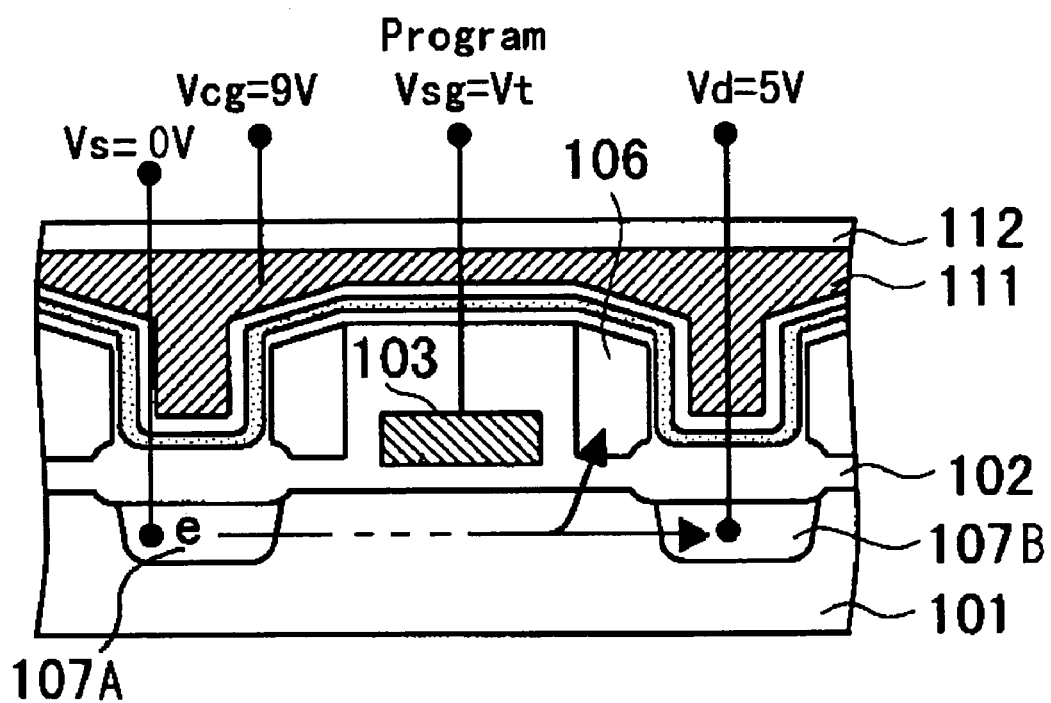
FIG. 29 is a diagram showing a program operation in the memory array according to another embodiment of the present invention.

Referring to FIG. 29, the program operation and read operation according to another embodiment of the present invention will now be described. Programming to the floating gate 106 of the sell is performed by:

applying a high voltage of about 9V is applied to the control gate electrode 111 constituting a selected word line (Vcg=9V);

applying a voltage of about 5V to one diffusion region (bit line N+ diffusion region) 107B forming a drain;

applying a ground potential (0V) to the other diffusion region (bit line N+ diffusion region) 107A forming a source, in which one and other diffusion regions constitute two diffusion regions associated with the cell; and applying a voltage Vt or Vt+α (where Vt is the threshold voltage, and α>0) is applied to the selection gate electrode 103 (Vsg=Vt).

Electrons e are supplied from the source diffusion region 107B and the channel in the substrate beneath the floating gate 106 is set in an on state by the voltage Vcg of the control gate electrode 111 independently of the data status so that the channel current is narrowed down by the channel of the selection gate. Since the channel resistance of the selection gate is higher than that of the regions other than selection gate, the electric fields are concentrated in the channel of the selection gate. The electron e is accelerated by the electric field in the channel region of the selection gate in which the electric field is concentrated and is injected into the floating gate 106 from the source side (the diffusion region 107A), thereby to execute a programming to the cell. In this case, each resistance of the diffusion regions respectively used as a source and a drain, is lower than that of the source line which utilizes the inversion layer under the selected gate so that the variance in voltage applied across the source and drain in the cell depending on the bit position may well be reduced and that the variance in programming characteristics with regard to the bit position in a memory cell array may be well suppressed, as a result of which the number of bits that need longer time in programming can be decreased to attain high-speed programming of the memory cell block.

Reading from the cell according to the present embodiment is performed by:

applying a high voltage of about 5V to the control gate electrode 111 constituting a selected word line;

applying a voltage of about 3V to the selection gate of the cell;

applying a voltage of about 1.4V to the common diffusion region (buried diffusion region 121 in FIG. 13) of the selection gate constituting a drain: and applying a ground potential (0V) to the diffusion region 107 (bit line N+ diffusion region) constituting a source.

On the other hand, as described with reference to FIG. 14, if a programming operation is performed by:

applying a high voltage of about 9V to the control gate electrode constituting a selected word line;

applying a voltage of about 5V to the diffusion region (bit line N+ diffusion region) 107 constituting a drain;

applying a voltage of about Vt (where Vt is a threshold voltage of the selection gate) to the selection gate electrode 103; and applying a ground potential (0V) to a common diffusion region of the selection gate (buried diffusion region 121 in FIG. 13) constituting a source, electrons are supplied from the common diffusion region of the selection gate (i.e., the buried diffusion region 121 in FIG. 13) and reach the edge of the floating gate through the inversion layer of the selection gate. Since the resistance in a gap portion between the selection gate and the floating gate is set to a comparatively high value, the electric field is concentrated in the source side edge portion of the floating gate. The programming operation is performed by accelerating electrons with the concentrated electric field to inject them into the floating gate. In this case, the distance between the cell and the source of electrons (the buried diffusion region 121 serving as a source) is different in accordance with the position of the cell in the memory cell array. In the programming operation, the inversion layer in the substrate created by the selection gate is used in the source line for supplying electrons. However, the sheet resistance of the inversion layer is comparatively high, such as 3.5 Kohm/□ and the source resistance for the cell is varied by the channel resistance of the selection gate, depending on the cell position in the memory cell array. The more spaced is the cell from the electron source, the higher is the source resistance value and the lower becomes the concentration of the electric field in the gap portion so that the programming operation becomes slow.

The embodiment described with reference to FIG. 29 improves the speed of the programming operation.

The programming method using adjacent 2-bit line N+ diffusion regions 107A and 107B as described with reference to FIG. 29, may well be applied to a semiconductor memory device as disclosed in JP-P2004-71646A which has an ONO film as a charge trapping film.

Figure 30:
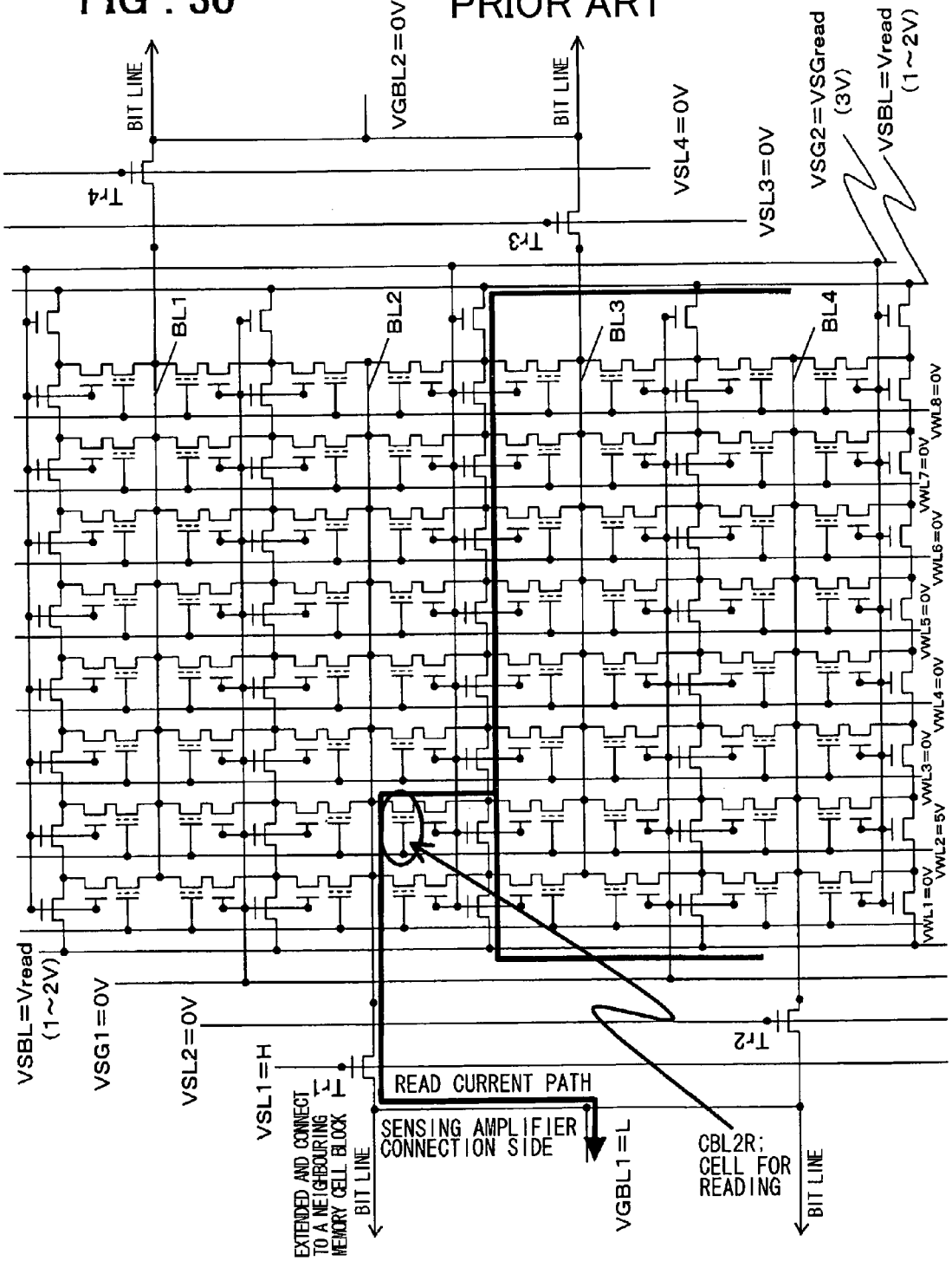
FIG. 30 is a diagram showing a configuration of the memory array according to another embodiment of the present invention.

The memory cell array according to still another embodiment of the present invention will now be described. In the memory cell array according to the present embodiment, a selection transistor for selecting a bit line (also termed as a local bit line) in a memory cell area is shared by adjacent memory cell blocks and the control of selection and non-selection of the adjacent memory cell blocks is performed by a selection gate of the memory cell. FIG. 30 is a diagram showing a circuit configuration of the memory cell array according to the present embodiment. Bits line provided in a memory cell block (memory cell area) are extended on both sides of the memory cell block alternately and connected to the associated selection transistors (also referred to as "bank selection transistors") (e.g., TR1, TR2; Tr3 and Tr4) respectively. More specifically, as shown in FIG. 30, one of source and drain electrodes of the bank selection transistor Tr1 which is located on the left side of the memory cell area and which has its gate electrode connected to a selection signal (bank selection signal), is connected via a contact to a bit line BL2 disposed in a first metal (aluminum) interconnection layer and the other one of source and drain electrodes of the bank selection transistor Tr1 is connected via a contact/via hole to a global bit line GBL1 disposed in a second metal (aluminum) interconnection layer and also is connected via a contact to a bit line disposed in the first metal interconnection layer and extending to another memory cell block (memory cell area) not shown and provided on the left side of the selection transistor Tr1. One of source and drain electrodes of the bank selection transistor Tr3 which is located on a right side of the memory cell area and which has its gate electrode connected to a selection signal (bank selection signal), is connected via a contact to a bit line BL3 disposed in the first metal interconnection layer and the other one of source and drain electrodes of the bank selection transistor Tr3 is connected via a contact/via hole to a global bit line GBL2 disposed in the second metal interconnection layer and also is connected via a contact to a bit line being disposed in the first metal interconnection layer and extending to still another memory cell block (memory cell area) not shown and provided on the right-side of the selection transistor Tr3. The bank selection transistors Tr2 and Tr4 are also shared in the same manner as bank selection transistors Tr1 and Tr3 by respective adjacent memory cell blocks with the selection transistors Tr2 and Tr4 therebetween. Any one of bit lines extending throughout neighboring memory cell blocks is selected by an associated bank selection transistor (TR1, TR2; Tr3 and Tr4) based on the bank selection signal received.

In the present embodiment, as mentioned above, the selection gates of the memory cell are provided independently for each one of memory cell blocks (refer to the selection gate terminals 124 in FIG. 13) and can be selected for each memory cell block. Any bit line extending throughout neighboring two memory cell blocks is selected by an associated bank selection transistor and one of neighboring two memory cell blocks is selected by a selection gate of the memory cell so that any bit line in a memory cell block can be uniquely selected. More specifically, as shown in FIG. 30, when the voltage of the bank selection signal VSL1 is at a high level, the bank selection transistor TR1 is turned on so that both of the bit line BL2 and a bit line which is also connected to the bank selection transistor TR1 and which is extended to a left side memory cell block not shown are selected. In this case, the voltages VSG1 and VSG2 of the selection gate terminals (124 in FIG. 13) in the left side memory cell block not shown are set to an inactive potential so that only bit line BL2 is selected and the read current is supplied from the bit line BL2 through the global bit line GBL1 to a sense amplifier not shown. In the write operation, in a similar way as in the read operation, a bit line extending throughout neighboring two memory cell blocks is selected by an associated bank selection transistor and one of neighboring two memory cell blocks is selected by a selection gate of the memory cell. In the present invention, any one of bit lines in memory cell blocks can be uniquely selected by a bank selection transistor and a selection gate of the memory cell.

In this embodiment, the selection of a bit line is executed by using not only a bank selection transistor but also a selection gate of the memory cell, as a result of which the number of bank selection transistors is reduced. The reduction of the number of bank selection transistors required for one memory cell block may well contribute to the shrinkage of a chip size.

Unless the circuit configuration described with reference to FIG. 30 is adopted, a bit line is uniquely selected only by an associated bank selection transistor. In this case, 2 systems of bank selection transistors must be provided on both side of each memory cell block so that total of 4 systems of bank selection transistors are necessary. This results in the enlargement of the chip size.

The foregoing is a description of the present invention in connection with the embodiments described above. The present invention, however, is not limited to the configurations of the embodiments described above, and naturally includes various variations and modifications which could be made by those skilled in the art within the scope of the claims of the inventions of the present application.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A semiconductor memory device comprising:
   a semiconductor substrate;
   a gate including an insulating film provided on said semiconductor substrate and a conductive film provided on said insulating film; and
   first and second diffusion regions provided apart to each other in a surface layer of said semiconductor substrate;
   wherein a channel which is formed in said surface layer of said semiconductor substrate immediately below said gate and forming a passage connecting said two diffusion regions that comprise a source and a drain, has a shape, in a top view of said semiconductor substrate, including:
      a first path extending from one of said two diffusion regions in one direction defined in association with a planar shape of said gate; and
      a second path extending from an end of said first path to the other of said two diffusion regions in a direction at a predetermined angle with said one direction.

2. The semiconductor memory device according to claim 1, further comprising a third diffusion region in said surface layer of said semiconductor substrate, said third diffusion region being disposed to face said second diffusion region with said gate interposed between said third diffusion region and said second diffusion region.

3. The semiconductor memory device according to claim 2, further comprising:
   a first floating gate including a first conductive film provided above said semiconductor substrate between said second diffusion region and said gate through an insulating film;

a second floating gate including a second conductive film provided above said semiconductor substrate between said gate and said third diffusion region through said insulating film; and a control gate including a third conductive film provided in common over said first and second floating gates through an insulating film, wherein said control gate comprises a word line; and said second diffusion region and said third diffusion region are connected to respective corresponding bit lines.

4. The semiconductor memory device according to claim 1, wherein said gate comprises a selection gate provided above said semiconductor substrate and disposed to be adjacent to a floating gate comprising a storage node.

5. A semiconductor memory device comprising:

a semiconductor substrate;

a first insulating film provided on said semiconductor substrate;

a floating gate including a conductive film provided on said first insulating film;

a control gate including a conductive film provided over said floating gate through a second insulating film; and at least first and second diffusion regions provided in a surface layer of said semiconductor substrate;

wherein a channel which is formed in said surface layer of said semiconductor substrate immediately below said gate and forming a passage connecting said two diffusion regions that comprise a source and a drain, has a shape, in a top view of said semiconductor substrate, including:

a first path extending from one of said two diffusion regions in one direction defined in association with a planar shape of said control gate; and a second path extending from an end of said first path to the other of said two diffusion regions in a direction at a predetermined angle with said one direction.

6. A semiconductor memory device having a semiconductor substrate and a plurality of unit cells, each comprising:

a first diffusion region provided in a surface of said semiconductor substrate;

a first insulating film provided in a first region on said semiconductor substrate adjacent to said first diffusion region;

a first gate electrode provided on said first insulating film and comprising a floating gate;

a second insulating film provided on said first gate electrode;

a second gate electrode provided on said second insulating film and comprising a control gate;

a third insulating film provided in a second region on said semiconductor substrate adjacent to said first diffusion region; and a third gate electrode provided on said third insulating film and comprising a selection gate;

wherein said second gate electrode three-dimensionally crosses said third gate electrode; and a second diffusion region is provided in a third region in said surface of said semiconductor substrate located at an extension of said third gate electrode.

7. A semiconductor memory device comprising:

a semiconductor substrate;

first and second diffusion regions provided in a surface of said semiconductor substrate in parallel to and apart from each other;

a selection gate electrode provided on a first insulating film disposed in a region on the surface of said semiconductor substrate between said first diffusion region and said second diffusion region;

a third diffusion region disposed in said surface of said semiconductor substrate and extending in a direction crossing said selection gate electrode;

a first floating gate electrode disposed in a first region between said first diffusion region and said selection gate through a second insulating film;

a second floating gate electrode disposed in a second region between said second diffusion region and said selection gate through a third insulating film; and a control gate electrode disposed over said first floating gate electrode, said second floating gate electrode, and said selection gate electrode through a fourth insulating film, wherein said first diffusion region, said first floating gate, said control gate electrode, said selection gate electrode, and said third diffusion region comprise a first unit cell; and said second diffusion region, said second floating gate, said control gate electrode, said selection gate electrode, and said third diffusion region comprise a second unit cell.

8. The semiconductor memory device according to claim 7, wherein a channel which is formed in a surface layer of said semiconductor substrate immediately below said selection gate and forming a passage connecting said third diffusion region and one of said first and said second diffusion regions, has a shape, in a top view of said semiconductor substrate, including:

a first path extending from said third diffusion region in a longitudinal direction of said gate electrode; and a second path extending from a position immediately below the control gate electrode selected to said one of said first and said second diffusion regions in a direction orthogonal to said first path, said first path being coupled to said second path at said position.

9. The semiconductor memory device according to claim 7, wherein said first diffusion region and said second diffusion region are formed in a self alignment process using said selection gate and said floating gate as a mask.

10. The semiconductor memory device according to claim 7, wherein said fourth insulating film comprises a multilayer dielectric film formed by stacking a silicon dioxide film, a silicon nitride film, and a silicon dioxide film atop one another in this stated order.

11. A semiconductor memory device comprising:

a semiconductor substrate;

a plurality of diffusion regions extending in parallel to one another and apart from one another along one direction in a memory cell area in a surface of said semiconductor substrate; each of said plurality of diffusion regions connected to a bit line corresponding thereto;

a plurality of selection gate electrodes, each disposed in a region above said semiconductor substrate between two of said diffusion regions adjacent to each other, through an insulating film and extending in said one direction;

one or more separate diffusion regions extending in a direction orthogonal to said one direction and provided at one or more positions in said surface layer of said semiconductor substrate, said one or more positions being separated from one end or both ends of said plurality of diffusion regions in a longitudinal direction thereof;

said selection gate electrodes crossing said one or more separate diffusion regions through an insulating film;

a first floating gate electrode provided in a first region between one of said two diffusion regions adjacent to each other and said selection gate electrode through an insulating film;

a second floating gate electrode provided in a second region between said selection gate electrode the other one of said two diffusion regions adjacent to each other through said insulating film; and a control gate electrode provided in common to said first floating gate and said second floating gate, said control gate electrode provided over said first floating gate and said second floating gate through a fourth insulating film, wherein a first unit cell comprises the one of said two diffusion regions, said first floating gate, said control gate electrode, said selection gate electrode, and said separate diffusion region; and a second unit cell comprises the other one of said two diffusion regions, said second floating gate, said control gate electrode, said selection gate electrode, and said separate diffusion region.

12. The semiconductor memory device according to claim 11, further comprising a plurality of selection transistors in a first side of two mutually opposed sides of said memory cell area and a second side in an opposite side of said first side, respectively;

wherein the selection transistors in said first side include:
  a first selection transistor having a first signal terminal thereof connected to a first global bit line, a second signal terminal thereof connected to a first bit line, and a control terminal thereof coupled to a first selection signal; and
  a second selection transistor having a first signal terminal thereof connected to said first global bit line, a second signal terminal thereof connected to a second bit line, and a control terminal thereof coupled to a second selection signal;
  said first and second bit lines being electrically connected to two of said diffusion regions corresponding thereto, respectively;

wherein the selection transistors in said second side includes:
  a third selection transistor having a first signal terminal thereof connected to a second global bit line, a second signal terminal thereof connected to a third bit line, and a control terminal thereof coupled to a third selection signal; and
  a fourth selection transistor having a first signal terminal thereof connected to said second global bit line, a second signal terminal thereof connected to a fourth bit line, and a control terminal thereof coupled to a fourth selection signal;
  said third and fourth bit lines being electrically connected to two of said diffusion regions corresponding thereto, respectively; and
  wherein columns of said diffusion regions corresponding to bit lines connected to said selection transistors in said first side and columns of said diffusion regions corresponding to bit lines connected to said selection transistors in said second side are alternately disposed.

13. The semiconductor memory device according to claim 12, further comprising:
  a first selection gate terminal formed of a conductive film and provided on said semiconductor substrate between a region where said selection transistors in said first side are disposed and a first separate diffusion region; said first selection gate terminal being disposed in a longitudinal direction of said first separate diffusion region through an insulating film;

a first group of said selection gate electrodes disposed on said semiconductor substrate through an insulating film, said first group of said selection gate electrodes having one ends connected to said first selection gate terminal and extending to said second side;

a second selection gate terminal formed of said conductive film provided on said semiconductor substrate between a region where said selection transistors in said second side are disposed and a second separate diffusion region, said second selection gate terminal being disposed in a longitudinal direction of said second separate diffusion region through said insulating film; and a second group of said selection gate electrodes disposed on said semiconductor substrate through said insulating film, said second group of said selection gate electrodes having one ends connected to said second selection gate terminal and extending to said first side;

wherein said first group of said selection gate electrodes extend to at least said second separate diffusion region;

said second group of said selection gate electrodes extend to at least said first separate diffusion region; and said first group of selection gate electrodes and said second group of selection gate electrodes are alternately disposed with said diffusion regions interposed therebetween, in said memory cell area.

14. The semiconductor memory device according to claim 13, wherein
  said selection transistor is shared by two memory cell areas adjacent each other with said selection transistor therebetween, such that the bit line in one of said two adjacent memory cell is connected to said second signal terminal of said selection transistor having said first signal terminal to which said global bit line is connected, while another bit line extending from said first signal terminal of said selection transistor is disposed in the other one of said two adjacent memory cell areas; and the control of selection and non-selection of said two adjacent memory cell areas sharing said selection transistor is performed with voltages respectively applied to said first and second selection gate terminals provided in said two adjacent memory cell areas.

15. The semiconductor memory device according to claim 12, wherein
  said selection transistor is shared by at least two memory cell areas adjacent each other with said selection transistor therebetween, such that the bit line in one of said two adjacent memory cell areas is connected to said selection transistor from which another bit line is extended into the other one of said two adjacent memory cell areas; and selection and non-selection of said two adjacent memory cell areas sharing said selection transistor are controlled by the selection gate electrode of said unit cell.

16. The semiconductor memory device according to claim 11, wherein a memory cell is configured to be divided into a plurality of sets for each of said plurality of word line electrodes; and said separate diffusion region is provided for a region between two of said plurality of sets adjacent to each other, in the surface layer of said semiconductor substrate.

17. The semiconductor memory device according to claim 11, wherein a first group of selection transistors is provided in a first side of mutually opposed two sides of said memory cell area, said first group of selection transistors each having a first signal terminal thereof connected to a corresponding one of a first group of global bit lines, a second signal terminal thereof connected to a corresponding one of a first group of bit lines, and a control terminal thereof coupled in common to a first selection signal, wherein a second group of selection transistors is provided in a second side opposite of said first side, said second group of selection transistors each having a first signal terminal thereof connected to a corresponding one of a second group of global bit lines, a second signal terminal thereof connected to a corresponding one of a second group of bit lines, and a control terminal thereof coupled in common to a second selection signal; and wherein columns of said diffusion regions corresponding to said first group of bit lines connected to said first group of selection transistors and columns of said diffusion regions corresponding to said second group of bit lines connected to said second group of selection transistors are alternately disposed.

18. The semiconductor memory device according to claim 11, wherein writing to the floating gate of the unit cell is performed by:

applying a predetermined positive voltage to the control gate electrode of the unit cell;
applying a threshold voltage (Vt) or a voltage higher than said threshold voltage (Vt) by a predetermined voltage to the selection gate electrode of the unit cell; and
applying a positive voltage to the bit line connected to the diffusion region for the unit cell, thereby using said separate diffusion region as an electron supply source.

19. The semiconductor memory device according to claim 11, wherein erasure of the unit cell is performed by applying a predetermined negative voltage to the control gate electrode of the unit cell and applying a positive voltage to said semiconductor substrate.

20. The semiconductor memory device according to claim 11, wherein erasure of the unit cell is performed by:

applying a predetermined negative voltage to the control gate electrode of the unit cell; applying a predetermined positive voltage to the bit line connected to the diffusion region for the unit cell; and
applying a positive voltage to the selection gate electrode of the unit cell.

21. The semiconductor memory device according to claim 11, wherein reading from the unit cell with the separate diffusion region as a drain side is performed by:

applying a predetermined positive voltage to the selection gate electrode of the unit cell for reading;
applying a ground potential to the bit line connected to the diffusion region for the unit cell; and
applying a predetermined positive voltage to the control gate electrode of the unit cell.

22. The semiconductor memory device according to claim 11, wherein writing to the floating gate of the unit cell is performed using said two adjacent diffusion regions as a source and a drain respectively; and reading from the unit cell is performed using said selection gate as a drain and one of said two adjacent diffusion regions as a source.

23. The semiconductor memory device according to claim 11, wherein writing to the floating gate of the unit cell is performed by:

applying a predetermined positive voltage to the control gate electrode of the unit cell;
applying a predetermined positive voltage to one of said two adjacent diffusion regions constituting a drain;
applying a ground potential to the other of said two adjacent diffusion regions constituting a source;
applying a threshold voltage (Vt) or a voltage higher than said threshold voltage (Vt) by a predetermined voltage to the selection gate electrode of the unit cell; and
applying a positive voltage to the bit line connected to the diffusion region for the unit cell, thereby using said diffusion region constituting a source as an electron supply source.

24. The semiconductor memory device according to claim 23, wherein reading from the unit cell is performed by:

applying a predetermined positive voltage to the control gate electrode of the unit cell;
applying a predetermined positive voltage to the selection gate electrode of the unit cell;
applying a predetermined positive voltage to the separate diffusion region of the selection gate constituting a drain; and
applying a ground potential to the diffusion region constituting a source.

* * * * *